(12) United States Patent
Kramer et al.

(10) Patent No.: US 9,379,746 B2
(45) Date of Patent: Jun. 28, 2016

(54) ISOLATION CIRCUITS FOR DIGITAL COMMUNICATIONS AND METHODS TO PROVIDE ISOLATION FOR DIGITAL COMMUNICATIONS

(71) Applicant: TEXAS INSTRUMENTS INCORPORATED, Dallas, TX (US)

(72) Inventors: Bradley Allen Kramer, Plano, TX (US); Mark W. Morgan, Allen, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/732,313

(22) Filed: Jun. 5, 2015

(65) Prior Publication Data

US 2015/0381219 A1 Dec. 31, 2015

Related U.S. Application Data

(60) Provisional application No. 62/018,969, filed on Jun. 30, 2014.

(51) Int. Cl.
*H04L 25/49* (2006.01)
*H04B 1/04* (2006.01)

(52) U.S. Cl.
CPC ...... *H04B 1/0475* (2013.01); *H04B 2001/0408* (2013.01)

(58) Field of Classification Search
CPC .... H03F 1/3247; H04L 27/368; H04L 1/0003
USPC ......................... 375/297, 295, 296
See application file for complete search history.

(56) References Cited

U.S. PATENT DOCUMENTS

| | | | |
|---|---|---|---|
| 5,686,846 A * | 11/1997 | Holcomb et al. | 327/37 |
| 9,075,696 B2 * | 7/2015 | Smith et al. | |
| 2003/0202537 A1 * | 10/2003 | Rogerson et al. | 370/478 |
| 2008/0136442 A1 * | 6/2008 | Chen | 326/21 |
| 2008/0209250 A1 * | 8/2008 | Fong | 713/500 |
| 2010/0250820 A1 * | 9/2010 | Gaalaas et al. | 710/305 |

(Continued)

OTHER PUBLICATIONS

Levy et al., "Design of Microwave Filters," Mar. 2002, 11 pages, IEEE Transactions on Microwave Theory and Techniques, vol. 50, No. 3.

(Continued)

*Primary Examiner* — Helene Tayong
(74) *Attorney, Agent, or Firm* — John R. Pessetto; Frank D. Cimino

(57) ABSTRACT

Isolation circuits for digital communications and methods to provide isolation for digital communications are disclosed. An example isolation circuit includes an isolation barrier, a burst encoder in a first circuit, and an edge pattern detector in a second circuit. The example isolation barrier electrically isolates the first circuit from the second circuit. The example burst encoder generates a first pattern in response to receiving a rising edge on an input signal and generates a second pattern in response to receiving a falling edge on the input signal. The example edge pattern detector detects the first pattern or the second pattern received from the burst encoder via the isolation barrier, sets an output signal at a first signal level in response to detecting the first pattern, and sets the output signal at a second signal level in response to detecting the second pattern.

10 Claims, 12 Drawing Sheets

(56) References Cited

U.S. PATENT DOCUMENTS

2011/0106997 A1* 5/2011 Romero et al. ............... 710/300
2014/0169038 A1* 6/2014 Kamath et al. .................. 363/16
2014/0346887 A1 11/2014 Bhamidipati et al.
2015/0004907 A1 1/2015 Subramoniam et al.

OTHER PUBLICATIONS

"Low Power Six-Channel Digital Isolator," 2013, 40 pages, Silicon Laboratories.
"1 Mbps, 2.5KVrms Digital Isolators," 2013, 52 pages, Silicon Laboratories.
Moghe et al., "Monolithic 2.5kV RMS, 1.8V-3.3V Dual-Channel 640Mbps Digital Isolator in 0.5μm SOS," 2012, 2 pages.
Nagai et al., "A Drive-by-Microwave Isolated Gate Driver with a High-speed Voltage Monitoring," Jun. 15-19, 2014, 4 pages, Proceedings of the 26th International Symposium on Power Semiconductor Devices & IC's, Waikoloa, Hawaii.
Nagai et al., "A DC-Isolated Gate Drive IC With Drive-by-Microwave Technology for Power Switching Devices," 2012, 3 pages, ISSCC 2012 / Session 23 / Advances in Heterogeneous Integration / 23.3.
Zhang et al., "Gate Drive Design Considerations for High Voltage Cascode GaN HEMT," 2014, 6 pages.

* cited by examiner

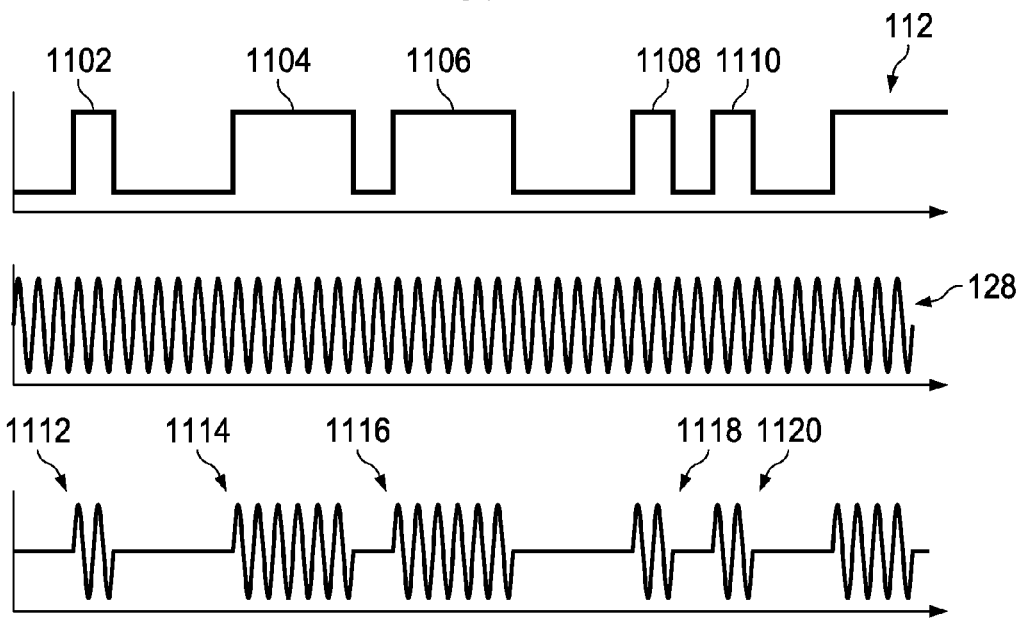
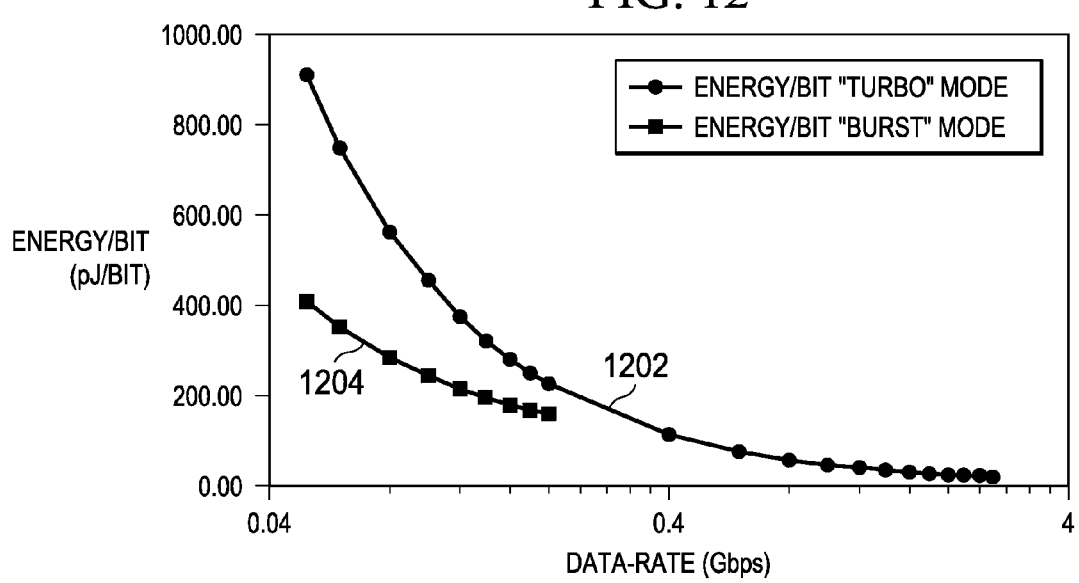

ISOLATION CIRCUITS FOR DIGITAL COMMUNICATIONS AND METHODS TO PROVIDE ISOLATION FOR DIGITAL COMMUNICATIONS

RELATED APPLICATION

This patent claims the benefit of U.S. Provisional Patent Application Ser. No. 62/018,969, which was filed on Jun. 30, 2014. The entirety of U.S. Provisional Patent Application Ser. No. 62/018,969 is incorporated herein by reference.

FIELD OF THE DISCLOSURE

This disclosure relates generally to digital communications, and, more particularly, to isolation circuits for digital communications and methods to provide isolation for digital communications.

BACKGROUND

Isolated signal communication refers to the transmission of data between electrically separate domains (e.g., domains having different electrical sources and/or references). Isolated signal communication has become an important requirement for equipment in technologies ranging from industrial motor control to medical equipment for patient monitoring. The required "error-free" data speeds for isolated signal communication range from less than 1 megabit per second (Mbps) to more than 6 gigabits per second (Gbps). Additionally, power efficiency requirements for isolated signal communication are increasing. Standards bodies and safety agencies have also increased the minimum breakdown voltage levels required of isolated signal communications devices for human safety.

SUMMARY

Isolation circuits for digital communications and methods to provide isolation for digital communications are disclosed. A disclosed example isolation circuit includes an isolation barrier, a burst encoder in a first circuit, and an edge pattern detector in a second circuit. The example isolation barrier electrically isolates the first circuit from the second circuit. The example burst encoder generates a first pattern in response to receiving a rising edge on an input signal and generates a second pattern in response to receiving a falling edge on the input signal. The example edge pattern detector detects the first pattern or the second pattern received from the burst encoder via the isolation barrier, sets an output signal at a first signal level in response to detecting the first pattern, and sets the output signal at a second signal level in response to detecting the second pattern.

A disclosed example method includes generating a first signal pattern in a first voltage domain in response to receiving a first rising edge on an input signal; transmitting the first signal pattern to an electrical isolation barrier; detecting the first signal pattern received in a second voltage domain via the electrical isolation barrier; in response to detecting the first signal pattern, outputting a second rising edge on an output signal in the second voltage domain; generating a second signal pattern in the first voltage domain in response to receiving a first falling edge on the input signal, the second signal pattern being different than the first signal pattern; transmitting the second signal pattern to the electrical isolation barrier; detecting the second signal pattern received in the second voltage domain via the electrical isolation barrier; and in response to detecting the second signal pattern, outputting a second falling edge on the output signal in the second voltage domain.

Another disclosed example apparatus includes a burst encoder, a power amplifier, an isolation barrier, a high pass filter, an envelope detector, and an edge pattern detector. The example burst encoder has a first input, a second input, a third input, and a first output, where the first output includes, during a first time period: when a rising edge is detected on the first input, a first number of electrical pulses generated using the second input or, when a falling edge is detected on the first input, a second number of electrical pulses generated using the third input during a time period. The example power amplifier has the first output as a fourth input and has a fifth input and a second output based on the fourth input and the fifth input. The example isolation barrier has the second output as a sixth input and has a third output representative of the sixth input. The sixth input is received from a first voltage domain and the third output being generated in a second voltage domain. The example high pass filter has the third output as a seventh input, and has a fourth output. The example high pass filter attenuates common mode transients from the seventh input to generate the fourth output. The example envelope detector has the fourth output as an eighth input and has a fifth output to include an envelope of the eighth input. The example edge pattern detector has the fifth output as a ninth input and having a sixth output. The example edge pattern detector counts a third number of electrical pulses received on the ninth input during a second time period, and sets the sixth output to a first signal level when the third number of electrical pulses received is equal to the first number of electrical pulses or sets the sixth output to a second signal level different than the first signal level when the third number of electrical pulses received is equal to the second number of electrical pulses.

BRIEF DESCRIPTION OF THE DRAWINGS

FIG. 11 illustrates example modulated signals generated by the power amplifiers of FIGS. 1 and/or 6 based on a continuous on-off keying scheme in "Turbo" mode.

FIG. 12 illustrates example energy-per-bit as a function of data-rate in a "Turbo" mode and a "Burst" mode for the example isolation device of FIG. 1.

The figures are not to scale. Wherever appropriate, the same reference numbers will be used throughout the drawing(s) and accompanying written description to refer to the same or like parts.

DETAILED DESCRIPTION

Figure 1:
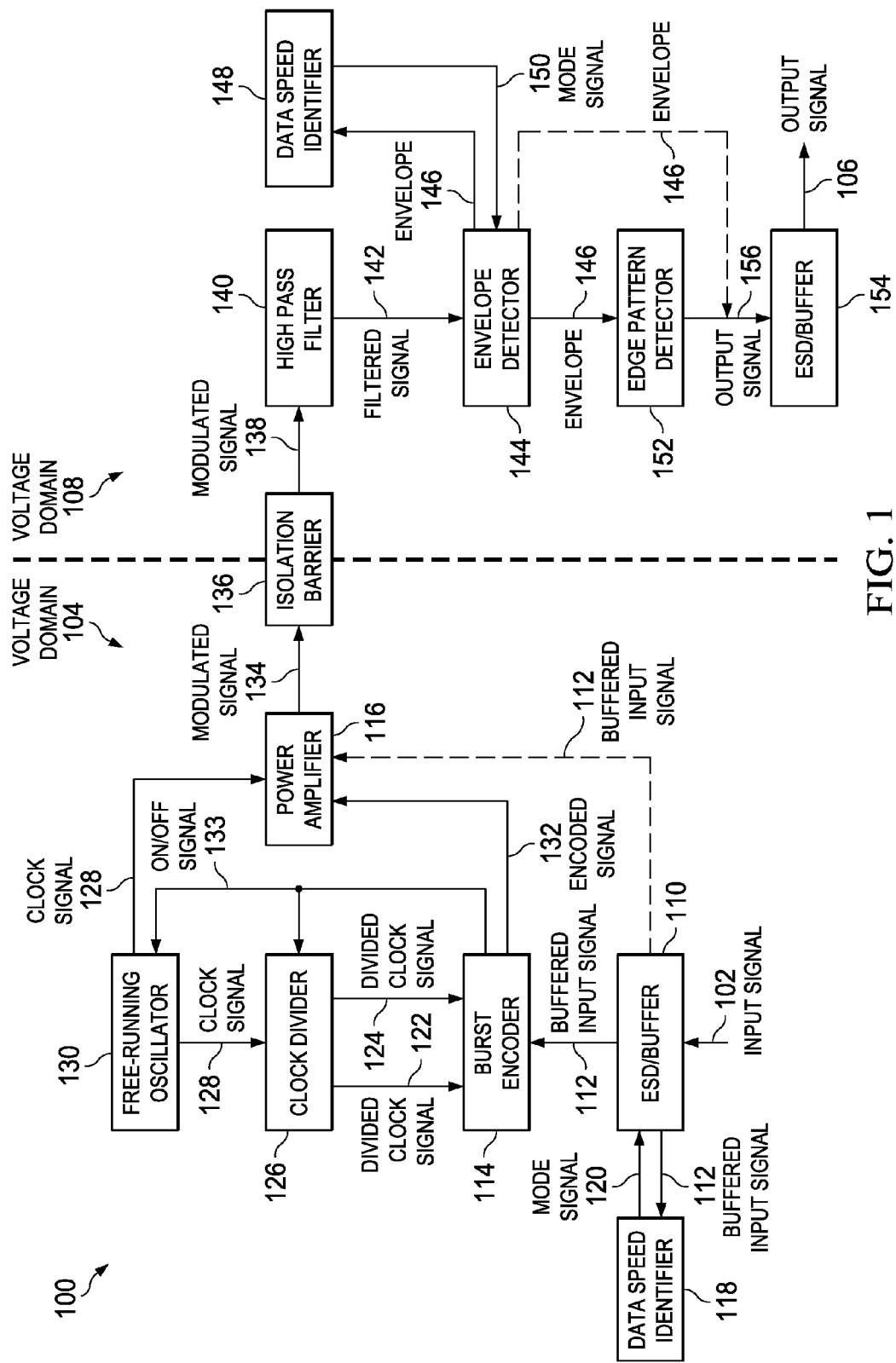
FIG. 1 is a block diagram of an example isolation device constructed in accordance with the teachings of this disclosure to provide digital communications, while providing common mode transient immunity.

Some applications of galvanically isolated data communication, such as isolated gate drivers, mandate increased immunities to common mode transients (CMT). As used herein, "common mode transient immunity" refers to the measure of the ability of an isolation circuit to reject fast transient noise signals (e.g., noise signals having a high frequency and/or bandwidth) that are present between the input and output sides of the isolation circuit. As used herein, common mode transient immunity does not require an absolute ability to block or reject common mode transients, but refers to the relative ability to reduce the effects of common mode transients (e.g., to reduce or avoid undesired effects to the isolation circuit or the circuits and/or equipment being connected by the isolation circuit).

Classic isolation solutions using capacitive, magnetic, and/or optical techniques are finding fundamental limits in capability to concurrently meet the need for both higher speed and provide higher levels of immunity to CMT.

Some disclosed examples may be implemented as an isolated high-speed data transfer system-in-package (SIP) that employs a galvanic isolation component based on radio frequency (RF) multi-resonant tank filters. Many of the disclosed examples are resilient to at least 150 kilovolts (kV) per microsecond (μs) (kV/μs) CMT while maintaining data transfer speeds less than or equal to 600 Mbps. CMT immunity is demonstrated by having less than a threshold propagation delay change in data communications in the presence of CMT. Disclosed examples also support an upper data-rate of 2.5 Gbps at an energy of approximately 20 picoJoules (pJ) per bit, while also meeting bit-error-rates (BER) less than $10^{-12}$ and are capable of exceeding reinforced isolation requirements used in human safety and/or medical applications.

Examples disclosed herein achieve CMT immunity by including a filter having a frequency pass-band that is several octaves higher in frequency than the frequencies at which the common-mode energy typically occurs. CMT typically occurs at frequencies on the order of hundreds of megaHertz (MHz). Thus, examples disclosed herein use carrier frequencies that are in the GHz range or higher to enable effective filtering of common-mode energy while avoiding filtering data communications or increasing bit error rates. In some examples, using high carrier frequencies also enables a reduction in physical form-factor and cost of the CMT suppression compared to lower carrier frequencies. In some examples, the frequency pass-band of the filter is in the radio frequency (e.g., wavelengths on the order of 1 millimeter). Furthermore, examples disclosed herein may be selectively operated at high data transfer speeds (e.g., in the GHz range) and at lower data transfer rates (e.g., less than 1 GHz) while maintaining high CMT immunity.

While a continuous-mode on-off keying (OOK) communication technique provides decreased power consumption (e.g., energy per bit) at high data-rates, continuous mode OOK has poor energy efficiency at lower data speeds. Examples disclosed herein are energy-efficient at both high data transfer speeds and lower data transfer speeds by supporting two communications modes: 1) an energy efficient edge-triggered "Burst" mode for lower data transfer speeds (e.g., less than 200 Mbps) and 2) a continuous-modulation "Turbo" mode that supports data transfer rates up to the upper data transfer rate (e.g., up to 2.5 Gbps).

FIG. 1 is a block diagram of an example isolation device 100 to provide digital communications while providing common mode transient immunity. The example isolation device 100 of FIG. 1 receives an input signal 102 in a first voltage domain 104 and generates an output signal 106 in a second voltage domain 108, where the output signal 106 represents (e.g., mirrors, duplicates) the input signal 102. In the example of FIG. 1, the output signal 106 duplicates the input signal 102, but keeps the voltage domains 104, 108 separate (e.g., to avoid interference or damage that may occur to devices in one of the voltage domains 104, 108 due to the voltages present in the other of the voltage domains 104, 108 that such devices are not equipped to handle).

The example input signal 102 is received at an ESD/Buffer circuit 110 in the first voltage domain 104. The example ESD/Buffer circuit 110 protects the isolation device 100 from electrostatic discharge on the input signal 102 and/or buffers the input signal 102. Additionally, the example ESD/Buffer circuit 110 may be configured to route a buffered input signal 112 (e.g., a buffered version of the input signal 102) to either a burst encoder 114 or to a power amplifier 116, which results in bypassing the burst encoder 114.

A data speed identifier 118 receives the buffered input signal 112 from the ESD/Buffer circuit 110 and determines a data rate of the buffered input signal 112. For example, the data speed identifier 118 may be a frequency detector that compares a detected frequency of the buffered input signal 112 to one or more frequency thresholds. For example, the frequency threshold(s) may represent the difference in data speed between using "Burst" mode and "Turbo" mode to transfer data.

In the example of FIG. 1, if the frequency of the buffered input signal has a frequency that is less than a frequency threshold, the data speed identifier 118 configures the ESD/Buffer circuit 110 (e.g., using a mode signal 120) to route the buffered input signal 112 to the burst encoder 114. Conversely, if the frequency of the buffered input signal is greater than a frequency threshold, the data speed identifier 118 configures the ESD/Buffer circuit 110 (e.g., using the mode signal 120) to bypass the burst encoder 114 and to route the buffered input signal 112 to the power amplifier 116.

The example burst encoder 114 receives the buffered input signal 112 from the ESD/Buffer circuit 110. The burst encoder 114 also receives divided clock signals 122, 124, which are generated by a clock divider 126 by dividing a clock signal 128 generated by a free-running oscillator 130. In some other examples, either or both of the divided clock signals 122, 124 are generated using independent oscillators and/or one or more pulse generating circuits.

When the isolation device 100 is operating in "Burst" mode, the example burst encoder 114 generates a first number of electrical pulses in response to detecting a rising edge in the buffered input signal 112. The example burst encoder 114 also generates a second number of electrical pulses in response to detecting a falling edge in the buffered input signal 112, where the first and second numbers of electrical pulses are different. The burst encoder 114 outputs the electrical pulses to the power amplifier 116 via an encoded signal 132.

When the example burst encoder 114 is not generating pulses, the burst encoder 114 does not drive the encoded signal 132. Instead, the encoded signal 132 may be pulled to a high voltage (e.g., logical 1), a low voltage (e.g., logical 0), or to an intermediate voltage. The state of the buffered input signal 112 (e.g., logical 1 or logical 0) can be deduced by monitoring and counting the electrical pulses output by the burst encoder 114 as the encoded signal 132. An example implementation of the burst encoder 114 is described below with reference to FIG. 2.

When the example burst encoder 114 is not generating pulses, the example burst encoder 114 controls the clock divider 126 and/or the free-running oscillator 130 via an on/off signal 133. The on/off signal 133 enables and/or disables the clock divider 126 and/or the free-running oscillator 130. When the clock divider 126 and/or the free-running oscillator 130 are disabled via the on/off signal 133, and/or when the burst encoder 114 does not drive the encoded signal 132 (thereby disabling the power amplifier 116), the example isolation device 100 conserves energy, which improves the energy-per-bit of the isolation device 100 in "Burst" mode. When the burst encoder 114 detects a rising edge or a falling edge on the buffered input signal 112, the example burst encoder 114 enables the clock divider 126 and/or the free-running oscillator 130 to begin generating the clock signal 128 and/or the divided clock signals 122, 124 before outputting pulses on the encoded signal 132 (e.g., one or two nanoseconds prior to beginning to output pulses on the encoded signal 132).

To generate the electrical pulses, the example burst encoder 114 uses the divided clock signals 122, 124 to output pulses for a period of time, where the divided clock signals 122, 124 have different effective clock speeds. For example, the clock divider 126 may divide the frequency $f_O$ of the free-running oscillator 130 by a first divisor $d_1$ to generate the divided clock signal 122 (e.g., $f_O/d_1$). Similarly, the clock divider 126 may divide the frequency $f_O$ of the free-running oscillator 130 by a second divisor $d_2$ to generate the divided clock signal 124 (e.g., $f_O/d_2$). If the first divisor $d_1$ is one-half of the second divisor $d_2$, the effective frequency of the divided clock signal 122 is twice the effective frequency of the divided clock signal 124.

The example burst encoder 114 may generate the electrical pulses to be output via the encoded signal 132 by selecting one of the divided clock signals 122, 124 when an edge is detected, based on whether the detected edge is a rising edge or a falling edge. Conversely, the example burst encoder 114 does not select either of the divided clock signals 122, 124 when an edge is not detected in the buffered input signal 112. When one of the divided clock signals 122, 124 is selected, the example burst encoder 114 outputs pulses (e.g., divided clock pulses) from the selected one of the divided clock signals 122, 124 for a selected period of time. In the example of FIG. 1, the period of time is the same regardless of which of the divided clock signals 122, 124 is selected, so that the number of pulses output during the period of time will be different based on which of the divided clock signals 122, 124 is selected.

For example, using the divisors $d_1$ and $d_2$ above, when the divided clock signal 122 is selected (e.g., in response to detecting a rising edge on the buffered input signal 112), the example burst encoder 114 will generate $(f_O/d_1)*t$ pulses during a time period t. When the divided clock signal 124 is selected (e.g., in response to detecting a falling edge on the buffered input signal 112), the example burst encoder 114 will generate $(f_O/d_2)*t$ pulses during a time period t, which is one-half of the number of electrical pulses $(f_O/d_1)*t$ due to the difference between the divisors $d_1$ and $d_2$.

In some other examples, the burst encoder 114 generates other types of patterns to encode rising edges and falling edges. For example, the burst encoder 114 may generate pulses using only one of the divided clock signals 122, 124, but for different lengths of time for rising edges and falling edges. For example, the burst encoder 114 may generate pulses using the divided clock signal 122 for a first length of time when a rising edge is detected and generate pulses using the divided clock signal 122 for a second length of time when a falling edge is detected. Any other types of patterns may additionally or alternatively be used to communicate rising edges and/or falling edges across the isolation barrier 136. The example of FIG. 1 is described using the example of generating and counting different numbers of pulses.

The example power amplifier 116 receives the clock signal 128 from the free-running oscillator 130 and receives either the encoded signal 132 or the buffered input signal 112. Using the clock signal 128 as a carrier frequency, the power amplifier 116 modulates the encoded signal 132 or the buffered input signal 112 to generate a modulated signal 134. An example implementation of the power amplifier 116 is described below with reference to FIG. 6.

The power amplifier 116 provides the modulated signal 134 to an isolation barrier 136. The isolation barrier 136 communicates the modulated signal 134 between the voltage domains 104, 108 while keeping the voltage domains 104, 108 separate (i.e., electrically isolated). Thus, the example isolation barrier 136 transfers a modulated signal 138, which is equivalent to the modulated signal 134 received from the power amplifier 116, to a high pass filter 140. In some examples, the clock signal 128, the modulated signal 134, and the modulated signal 138 are differential signals.

The example high pass filter 140 of FIG. 1 provides CMT immunity to the isolation device 100 by attenuating CMTs that may be present on the modulated signal 138. The example free-running oscillator 130 oscillates at a frequency that is significantly higher than the frequencies at which CMTs are likely to occur in the isolation device 100. For example, while CMTs may occur in the tens or hundreds of MHz, the example free-running oscillator 130 generates the clock signal 128 at multiple octaves higher than the CMT frequencies (e.g., in the GHz range). The example high pass filter 140 has a corner frequency (e.g., a frequency below which signals are attenuated so as to be considered negligible for those frequencies) below the frequency of the modulated signal 138 but higher than the frequencies at which CMTs may occur. Thus, CMTs are attenuated and the modulated signal 138 is not. In some examples, the isolation barrier 136 has a band-pass response that enhances the CMT immunity provided by the high pass filter 140.

Example implementations of the isolation barrier 136 are described in U.S. patent application Ser. No. 14/050,984, filed Oct. 10, 2013, and U.S. patent application Ser. No. 14/311,354, filed Jun. 23, 2014. The entireties of U.S. patent application Ser. No. 14/050,984 and U.S. patent application Ser. No. 14/311,354 are incorporated herein by reference.

The example high pass filter 140 outputs a filtered signal 142 to an envelope detector 144. The example envelope detector 144 of FIG. 1 detects and outputs an envelope signal 146 of the filtered signal 142. That is, the envelope detector 144 de-modulates the data from the carrier frequency. In some examples, the envelope signal 146 represents the encoded signals 132.

The example envelope detector 144 of FIG. 1 provides the envelope signal 146 to a data speed identifier 148. Like the data speed identifier 118, the example data speed identifier 148 determines whether the data speed of data being transferred via the isolation device 100 is less than a threshold data speed. In contrast to the data speed identifier 118, the example data speed identifier 148 determines the data speed based on the envelope signal 146 corresponding to the modulated signal 138. If the data speed is less than a threshold (e.g., the threshold used by the data speed identifier 118), the example data speed identifier 148 configures the envelope detector 144 using a mode signal 150 to provide the envelope signal 146 to an edge pattern detector 152. Conversely, if the data speed is at least the threshold data speed, the example data speed identifier 148 configures the envelope detector 144 using the mode signal 150 to bypass the edge pattern detector 152 and to provide the envelope signal 146 to an ESD/Buffer circuit 154.

When the data speed identifiers 118, 148 determine that the data speed is higher than the threshold, the isolation circuit 100 communicates the data received at the input signal 102 across the isolation barrier 136 to the output signal 106 via continuous on-off keying (OOK). For example, the power amplifier 116 may modulate the clock signal 128 to generate the modulated signal 134 when the buffered input signal 112 is in a high signal level (e.g., logical 1). The power amplifier 116 holds the signal at a set signal level (e.g., a low signal level, etc.) when the buffered input signal 112 is in a low signal level (e.g., logical 0). While this example discusses continuous on-off keying, other modulation schemes may be used.

The example edge pattern detector 152 determines whether a rising or falling edge has occurred in the envelope signal 146. For example, the edge pattern detector 152 of FIG. 1 determines whether a first number of pulses is received (e.g., representative of a rising edge on the input signal 102) or a second number of pulses is received (e.g., representative of a falling edge on the input signal 102). The edge pattern detector 152 generates an output signal 156 based on the detections of pulses. For example, when the edge pattern detector 152 detects a first number of pulses between periods of the envelope signal 146 being idle, the edge pattern detector 152 sets the output signal 156 to be a high level (e.g., logical 1). When the edge pattern detector 152 detects a second number of pulses between periods of the envelope signal 146 being idle, the edge pattern detector 152 sets the output signal 156 to be a low level (e.g., logical 0). When the envelope is idle (e.g., a constant voltage or current), the example edge pattern detector 152 maintains a same value for the output signal 156. An example implementation of the edge pattern detector 152 is described below with reference to FIG. 4.

In some other examples, the edge pattern detector 152 detects other types of patterns that may be generated by the burst encoder 114 to encode rising edges and falling edges. For example, the edge pattern detector 152 may implement frequency detection to detect, in the envelope signal 146, a first frequency corresponding to the divided clock signal 122 (e.g., to detect a rising (or falling) edge pattern) and/or to detect, in the envelope signal 146, a second frequency corresponding to the divided clock signal 124 (e.g., to detect a falling (or rising) edge pattern).

In other examples, the edge pattern detector 152 may detect a length of time that pulses are detected in the envelope signal 146, where a first length of time corresponds to a rising edge and a second length of time corresponds to a falling edge. In such examples, the burst encoder 114 is configured to use one divided clock signal (e.g., the divided clock signal 122) to output pulses for the first length of time when a rising edge is detected in the buffered input signal 112 and/or for the second length of time when a falling edge is detected in the buffered input signal 112. Any other types of patterns may additionally or alternatively be used to communicate rising edges and/or falling edges across the isolation barrier 136.

The example ESD/Buffer circuit 154 provides electrostatic discharge protection and/or output buffering. The example ESD/Buffer circuit 154 receives the output signal 156 in Burst mode or receives the envelope signal 146 in Turbo mode, and generates the output signal 106 to repeat the received output signal 156 or the envelope signal 146.

Figure 2:
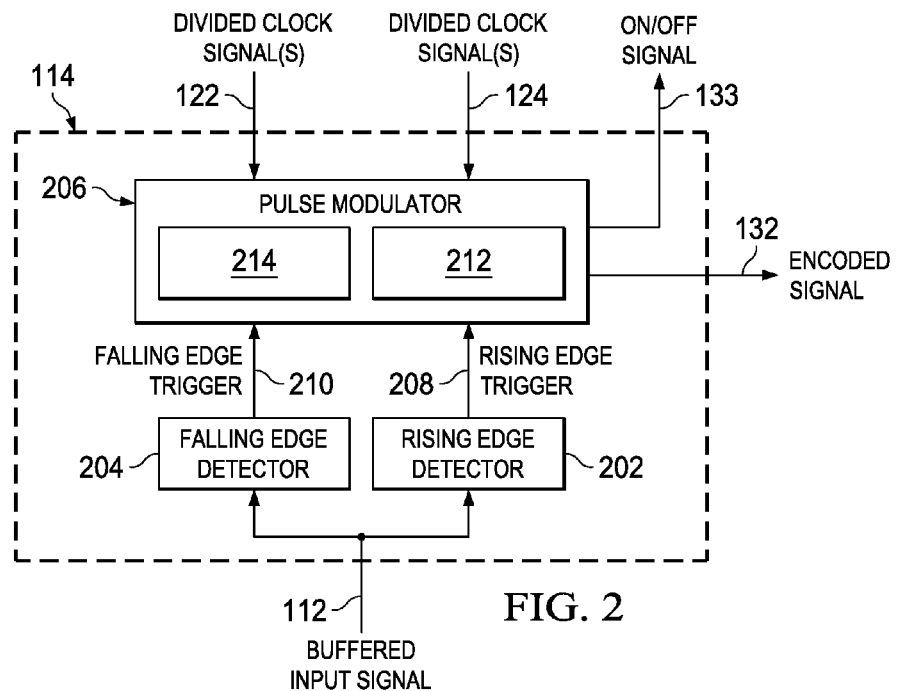
FIG. 2 is a block diagram of an example burst encoder that may be used to implement the burst encoder of FIG. 1.

FIG. 2 is a block diagram of an example burst encoder 114 of FIG. 1. The example burst encoder 114 of FIG. 2 receives the buffered input signal 112 and the divided clock signal(s) 122, 124 of FIG. 1, and generates the encoded signal 132. The burst encoder 114 includes a rising edge detector 202, a falling edge detector 204, and a pulse modulator 206. The example buffered input signal 112 is a digital signal.

The example rising edge detector 202 detects a rising edge (i.e., a change from low voltage to high voltage) on the buffered input signal 112. For example, the rising edge detector 202 may be an edge-triggered latch circuit configured to output a rising edge trigger signal 208 when a rising edge is detected on the buffered input signal 112. Thus, when the rising edge detector 202 detects a rising edge, the example rising edge detector 202 outputs the rising edge trigger signal 208 to the pulse modulator 206. In some examples, the rising edge trigger signal 208 is a pulse.

The example falling edge detector 204 detects a falling edge (i.e., a change from high voltage to low voltage) on the buffered input signal 112. For example, the falling edge detector 204 may be an edge-triggered latch circuit configured to output a falling edge trigger signal 210 when a falling edge is detected on the buffered input signal 112. Thus, when the falling edge detector 204 detects a falling edge, the example falling edge detector 204 outputs the falling edge trigger signal 210 to the pulse modulator 206. In some examples, the falling edge trigger signal 210 is a pulse.

The rising edge detector 202 and the falling edge detector 204 are configured based on the upper data speed of "Burst" mode, such that the width(s) of the pulses of the rising edge trigger signal 208 and the falling edge trigger signal 210 enable the rising edge detector 202 and the falling edge detector 204 to recover and generate another pulse in response to the next rising edge or falling edge on the buffered input signal 112.

The example pulse modulator 206 of FIG. 2 receives the rising edge trigger signal 208 and the falling edge trigger signal 210. When the rising edge trigger signal 208 and the falling edge trigger signal 210 do not have pulses, the example pulse modulator 206 is idle and does not force a signal level at the encoded signal 132. Thus, when there are no rising or falling edges in the buffered input signal 112, the example pulse modulator 206 conserves energy by not generating pulse(s). As mentioned above, the burst encoder 114 also conserves energy when the example burst encoder 114 is not generating pulses by controlling the clock divider 126 and/or the free-running oscillator 130 via the on/off signal 133. For example, when the rising edge trigger signal 208 and the falling edge trigger signal 210 do not have pulses, the example pulse modulator 206 outputs the on/off signal 133 to disable the clock divider 126 and/or the free-running oscillator 130.

In response to a pulse on the rising edge trigger signal 208, the example pulse modulator 206 outputs a first number of pulses as the encoded signal 132. For example, the pulse modulator 206 may activate a first switching circuit 212 to output the divided clock signal 122 for a first threshold period of time and/or a first threshold number of pulses. Outputting the divided clock signal 122 for the first threshold period of time results in outputting the first threshold number of pulses, but the switching circuit 212 may be triggered to stop outputting the divided clock signal 122 based on either the first threshold period of time or a first threshold number of pulses.

In response to a pulse on the falling edge trigger signal 210, the example pulse modulator 206 outputs a second number of pulses as the encoded signal 132. For example, the pulse modulator 206 may activate a second switching circuit 214 to output the divided clock signal 124 for the first threshold period of time and/or a second threshold number of pulses, which is different than the first threshold number of pulses. Outputting the divided clock signal 124 for the first threshold period of time results in outputting the second threshold number of pulses, but the switching circuit 214 may be triggered to stop outputting the divided clock signal 124 based on either the first threshold period of time or a first threshold number of pulses.

After generating and outputting the first or second number of pulses as the encoded signal 132, the example pulse modulator 206, the example power amplifier 116, and/or the example free-running oscillator 130 return to an idle state until the next edge is detected on the buffered input signal 112.

The example switching circuits 212, 214 of FIG. 2 may buffer and/or amplify the respective divided clock signals 122, 124 to support a load when the divided clock signals 122, 124 are output as the encoded signal 132.

Figure 3:
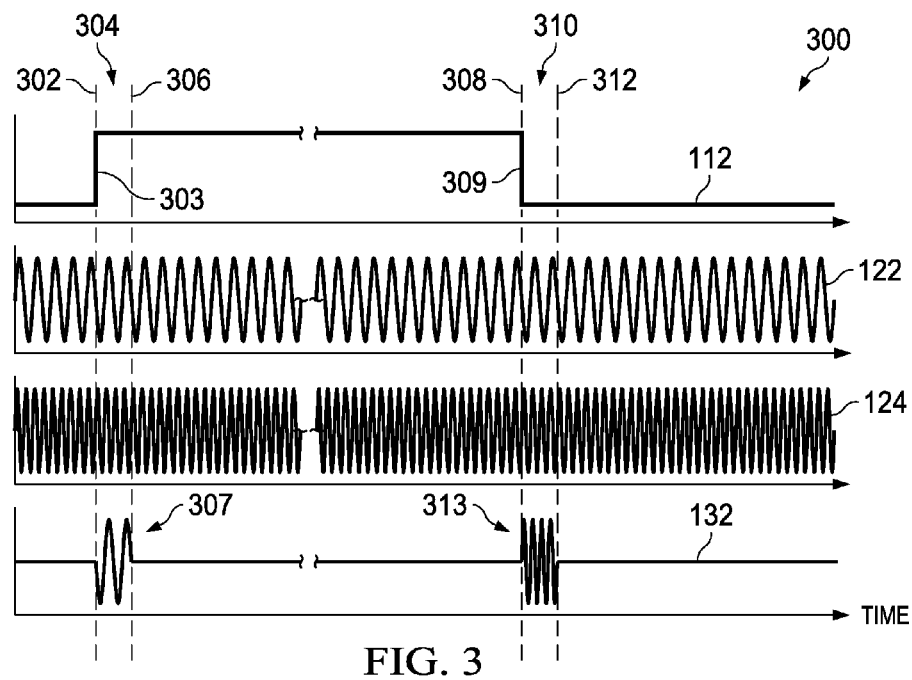
FIG. 3 illustrates examples of electrical pulses generated by the burst encoders of FIGS. 1 and/or 2 in an encoded signal in response to detecting rising and falling edges of an input signal during a time period.

FIG. 3 illustrates examples of electrical pulses generated by the burst encoders 114 of FIGS. 1 and/or 2 in an encoded signal in response to detecting rising and falling edges of the buffered input signal 112 during a time period 300. FIG. 3 also illustrates the example divided clock signals 122, 124 used to generate the encoded signal 132.

In the example of FIG. 3, the buffered input signal 112 begins the time period 300 in a logical low state and the encoded signal 132 begins the time period 300 in an idle state. The example divided clock signals 122, 124 continue running during the time period 300.

At a first time 302, the example buffered input signal 112 changes from a logical low level (e.g., voltage level, current level) to a logical high level (e.g., a rising edge 303). The example rising edge detector 202 of the burst encoder 114 of FIG. 2 detects the rising edge 303 and outputs the rising edge trigger signal 208 to the pulse modulator 206. The example switching circuit 212 applies the divided clock signal 122 for a period of time 304, from the first time 302 to a second time 306, to generate the encoded signal 132. As a result, the encoded signal 132 is controlled to output two pulses 307 (e.g., two cycles of the divided clock signal 122). After the second time 306, the encoded signal 132 returns to an idle signal level.

At a third time 308, the example buffered input signal 112 changes from a logical high level to a logical low level (e.g., a falling edge 309). The example falling edge detector 204 of the burst encoder 114 of FIG. 2 detects the falling edge 309 and outputs the falling edge trigger signal 210 to the pulse modulator 206. The example switching circuit 214 applies the divided clock signal 124 for a period of time 310, from the third time 308 to a fourth time 312, to generate the encoded signal 132. The example period of time 310 has the same duration as the period of time 304. As a result, the encoded signal 132 is controlled to output four pulses 313 (e.g., four cycles of the divided clock signal 124) in the same duration as the two pulses 307 generated to encode the rising edge 303. After the fourth time 312, the encoded signal 132 returns to an idle signal level.

While the example signals 122, 124, 132 are shown as analog signals in FIG. 3, the signals 122, 124, and/or 132 may alternatively be implemented using digital signals.

Figure 4:
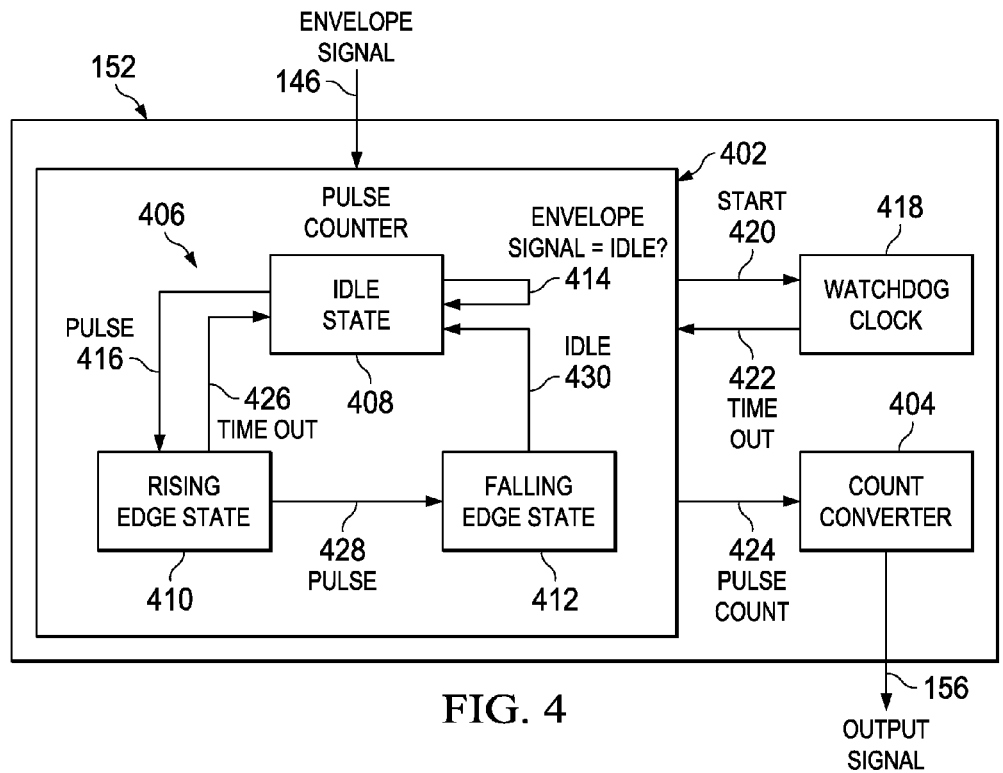
FIG. 4 is a block diagram of an example edge pattern detector that may be used to implement the edge pattern detector of FIG. 1.

FIG. 4 is a block diagram of an example edge pattern detector 152 of FIG. 1. The example edge pattern detector 152 receives the envelope signal 146 and generates the output signal 156 of FIG. 1. The edge pattern detector 152 of FIG. 4 includes a pulse counter 402 and a count converter 404.

The example pulse counter 402 of FIG. 4 receives the envelope signal 146 and counts a number of pulses occurring between periods of the envelope signal 146 being idle. For example, the pulse counter 402 may implement a state machine 406 that tracks whether a number of pulses received in the envelope signal 146 is a first number of pulses or a second number of pulses. The example state machine 406 of FIG. 4 is configured with a priori knowledge of the first number of pulses generated by the burst encoder 114 of FIG. 1 to encode a rising edge and the second number of pulses generated by the burst encoder 114 to encode a falling edge.

The example state machine 406 illustrated in FIG. 4 assumes a simple example in which the burst encoder 114 of FIG. 1 generates one pulse (e.g., one cycle of the divided clock signal 122) to encode a rising edge and generates two pulses (e.g., two cycles of the divided clock signal 124) to encode a falling edge. The example state machine 406 includes an idle state 408, a rising edge state 410, and a falling edge state 412. The state machine 406 begins in the idle state 408, which corresponds to the envelope signal 146 being in an idle state (e.g., not driven to a high or low logic state). While the pulse counter 402 determines that the envelope signal 146 remains in an idle state (e.g., transition 414, Envelope Signal=Idle?), the example state machine 406 remains in the idle state 408.

When the pulse counter 402 detects a pulse, the example state machine 406 transitions (e.g., a Pulse transition 416) to the rising edge state 410 that corresponds to 1 pulse being received. The example transition 416 to the rising edge state 410 may also trigger the running of a watchdog timer 418 (or time out clock) to limit the time that the pulse counter 402 may attribute pulses to a particular rising or falling edge. For example, when a first pulse is identified by the pulse counter 402, the pulse counter 402 may initiate the watchdog timer 418 via a start signal 420, which causes the watchdog timer 418 to count (e.g., measure) a specified period of time (e.g., counts up/down from a specified count at a specified rate). The example start signal 420 causes the watchdog timer 418 to reset the time period counter and to begin counting. When the watchdog timer 418 reaches the end of the specified time period, the watchdog timer 418 sends a time out signal 422 to the pulse counter 402.

If the pulse counter 402 receives the time out signal 422 while in the rising edge state 410, the example pulse counter 402 determines that the first number of pulses was received and outputs the first number of pulses as a pulse count signal 424 to the count converter 404. The example pulse count signal 424 may be, for example, any analog or digital signal that may be identified by the count converter 404. The example pulse counter 402 also transitions the state machine 406 from the rising edge state 410 to the idle state 408 via the time out transition 426.

On the other hand, if the pulse counter 402 identifies another pulse (e.g., a second pulse) in the envelope signal 146 while in the rising edge state 410 and before the pulse counter 402 receives the time out signal 422 from the watchdog timer 418, the example pulse counter 402 transitions the state machine 406 to the falling edge state 412 via a second Pulse transition 428.

In the example of FIG. 4, because no more than 2 pulses are expected at a time, when the state machine 406 enters the falling edge state 412, the example pulse counter 402 outputs the second number of pulses (e.g., 2 pulses) as a pulse count signal 424 to the count converter 404. The example pulse counter 402 then returns the state machine 406 to the idle state 408 via an idle transition 430.

The example count converter 404 receives the pulse count signal 424 from the pulse counter 402 and generates the output signal 156 based on the value in the pulse count signal 424. When the pulse count signal 424 represents a first number of pulses (e.g., one pulse), the count converter 404 sets the output signal 156 to a high voltage level (e.g., logical 1) corresponding to the rising edge at the input signal 102 that is encoded using the first number of pulses. Similarly, when the pulse count signal 424 represents a second number of pulses (e.g., two pulses), the count converter 404 sets the output signal 156 to a low voltage level (e.g., logical 0) corresponding to the falling edge at the input signal 102 that is encoded using the second number of pulses. When the pulse count signal 424 is idle (e.g., does not represent either the first number of pulses or the second number of pulses, corresponding to an idle voltage level in the envelope signal 146), the example count converter 404 maintains (e.g., enforces) the same signal level at the output signal 156.

Figure 5:
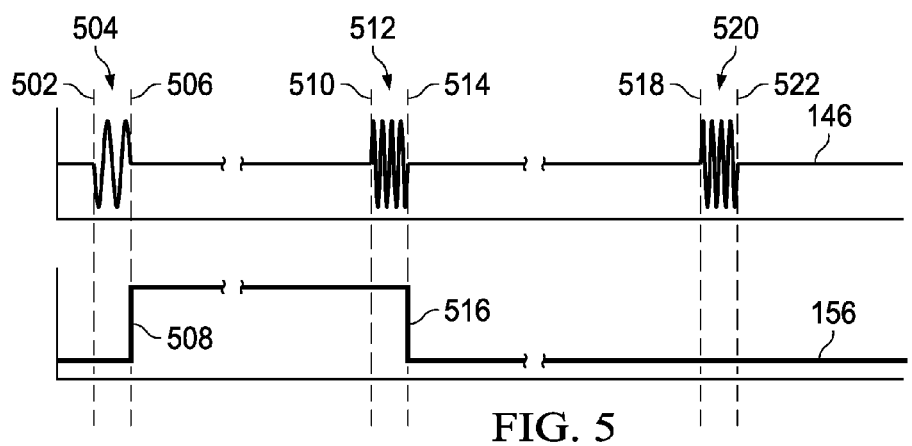
FIG. 5 illustrates example output signals generated by the edge pattern detectors of FIGS. 1 and/or 4 based on counting electrical pulses present in an envelope signal of FIG. 1 during a time period.

While the example pulse counter 402 and/or the example state machine 406 of FIG. 4 expect one pulse for a rising edge and two pulses for a falling edge, the example pulse counter 402 and/or the state machine 406 may expect other numbers of pulses. In the example of FIG. 5 below, two pulses are used to communicate a rising edge and four pulses are used to communicate a falling edge.

FIG. 5 illustrates example output signals 156 generated by the edge pattern detectors 152 of FIGS. 1 and/or 4 based on counting electrical pulses present in an envelope signal 146 of FIG. 1 during a time period 500. At the beginning of the example time period 500, the example pulse counter 402 of FIG. 4 begins with the state machine 406 in the idle state 408, the envelope signal 146 is in an idle state, and the output signal 156 is in a logical low level (e.g., logical 0). In the example of FIG. 5, the pulse counter 402 implements a state machine that differentiates between 2 pulses and 4 pulses during a specified time period. Each specified time period begins with the first pulse in a sequence of pulses and extends for a specified duration that is sufficient to capture the two pulses or the four pulses.

At a first time 502, the example pulse counter 402 receives two pulses. Starting at the first time 502 (or after a detection delay) the example pulse counter 402 initializes the watchdog timer 418, which counts the specified first time period 504 that ends at a second time 506. During the first time period 504, the example pulse counter 402 counts the two pulses (e.g., via a state machine that can discriminate between the two pulses and the four pulses during the time period 504). In response to identifying the two pulses during the first time period 504, the example count converter 404 changes the output signal 156 from a low voltage level (e.g., logical 0) to a high voltage level (e.g., logical 1), creating a rising edge 508 in the output signal 156, at the second time 506.

At a third time 510, the example pulse counter 402 receives four pulses. Starting at the third time 510 (or after a detection delay) the example pulse counter 402 initializes (or re-initializes) the watchdog timer 418, which counts a specified second time period 512 that ends at a fourth time 514. During the second time period 512, the example pulse counter 402 counts the four pulses (e.g., via the state machine). In response to identifying the four pulses during the second time period 512, the example count converter 404 changes the output signal 156 from the high voltage level (e.g., logical 1) to the low voltage level (e.g., logical 0), creating a falling edge 516 in the output signal 156, at the fourth time 514.

At a fifth time 518, the example pulse counter 402 receives four pulses. Starting at the fifth time 518 (or after a detection delay) the example pulse counter 402 initializes (or re-initializes) the watchdog timer 418, which counts a specified third time period 520 that ends at a fourth time 522. During the third time period 520, the example pulse counter 402 counts the four pulses (e.g., via the state machine). Because four pulses indicates a falling edge, but the output signal 156 is already at a low voltage level (e.g., logical 0), the example count converter 404 does not change the output signal 156, and instead continues to enforce the low voltage level (e.g., logical 0).

While the example signal 146 is shown an analog signal in FIG. 5, the signal 122, 124, and/or 132 may alternatively be implemented using digital signals.

Figure 6:
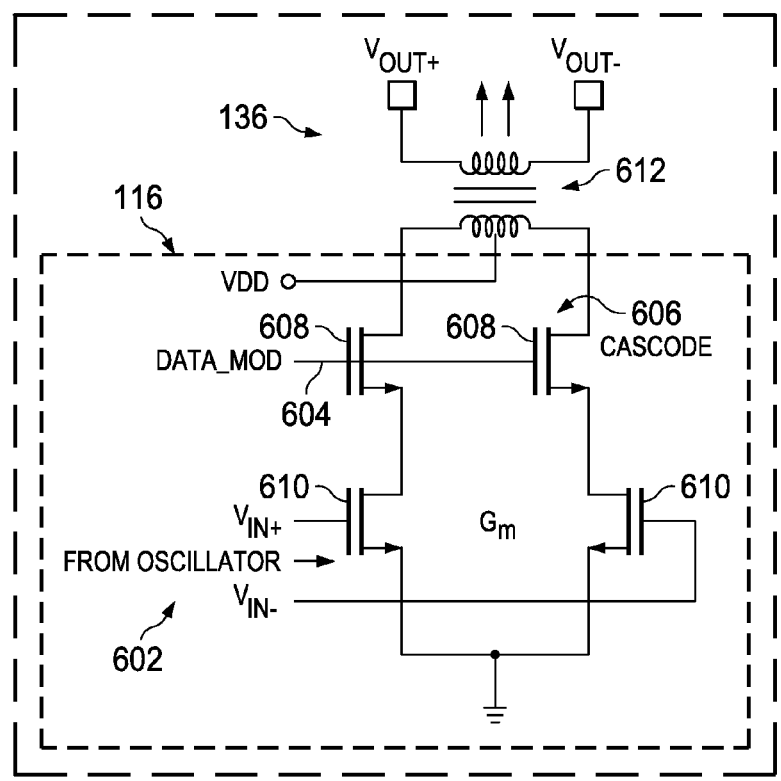
FIG. 6 is an example power amplifier that may be used to implement the power amplifier of FIG. 1.

FIG. 6 is an example power amplifier 116 of FIG. 1. The example power amplifier 116 of FIG. 6 is a cascode-type amplifier that receives a differential voltage 602 (e.g., an LVDS signal) from the free-running oscillator 130 of FIG. 1. The power amplifier 116 also receives either the encoded signal 132 in "Burst" mode or the buffered input signal 112 in "Turbo" mode as a data signal 604 (e.g., as controlled and/or configured by the data speed identifier 118 of FIG. 1).

In the example of FIG. 6, modulation is achieved by turning a cascode stage 606 of the power amplifier 116 on and off via the data signal 604. The architecture of the example power amplifier 116 of FIG. 6 enables a reduced circuit complexity, fast turn on, and low power consumption. Because the encoded signal 132 that is used as the data signal 604 in the "Burst" mode is created using a frequency-divided version of the clock signal 128, the modulated signal 134 is coherent with the carrier signal (e.g., the clock signal 128) and the resulting pulse shapes in the modulated signal 134 are consistent. On an edge in the input signal 102 (e.g., rising edge and/or falling edge), pulses in the encoded signal 132 enable and/or disable the cascode stage 606 as the pulses enable and disable data modulation transistors 608, while oscillation transistors 610 in the cascode stage 606 that are connected to the free-running oscillator 130 oscillate at a frequency of the clock signal 128 (e.g., via the differential voltage 602). As a result, the pulses in the encoded signal 132 are burst out in an envelope of the clock signal 128 via the modulated signal 134 (e.g., a differential voltage signal). In the "Turbo" mode, the buffered input signal 112 bypasses the burst encoder 114 and directly modulates the cascode stage 606 of the power amplifier 116.

The example power amplifier 116 of FIG. 6 is in communication with the isolation barrier 136 via an output transformer 612. In the example of FIG. 6, the output transformer 612 is an air-gapped transformer.

Figure 7:
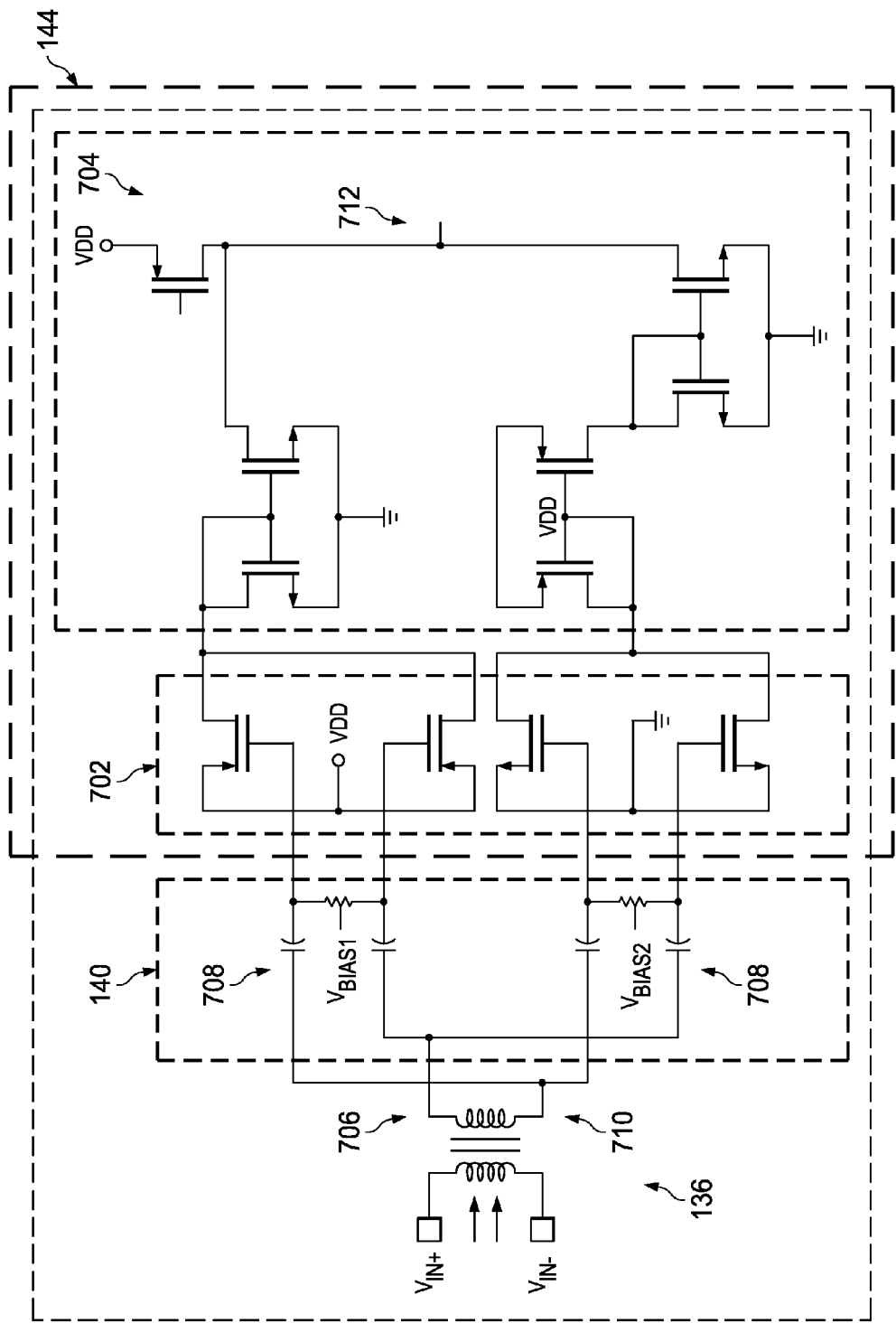
FIG. 7 is an example envelope detector that may be used to implement the example envelope detector of FIG. 1.

FIG. 7 is an example envelope detector 144 of FIG. 1. The example envelope detector 700 of FIG. 7 employs a PMOS push-push stage 702 and a NMOS push-push stage 704 for rectification of the modulated signal 138 of FIG. 1. As mentioned above, the modulated signals 134, 138 may be differential signals. Differential input signals 706 are shared through separate AC-coupling capacitors 708, mirrored, and folded into the PMOS push-push stage 702 (e.g., a common PMOS load).

The example envelope detector 700 of FIG. 7 is in communication with the isolation barrier 136 via an input transformer 710. In the example of FIG. 7, the input transformer 710 is an air-gapped transformer. The example input transformer 710 couples the differential input signal 706 from the isolation barrier 136 to the envelope detector 700 while resonating out cumulative gate capacitance and providing transformation gain. The example envelope detector 700 outputs an output signal 712 (e.g., the envelope signal 146 of FIG. 1). In "Burst" mode, the example output signal 712 includes pulses that may be detected and/or counted to identify rising and/or falling edges.

Figure 9:
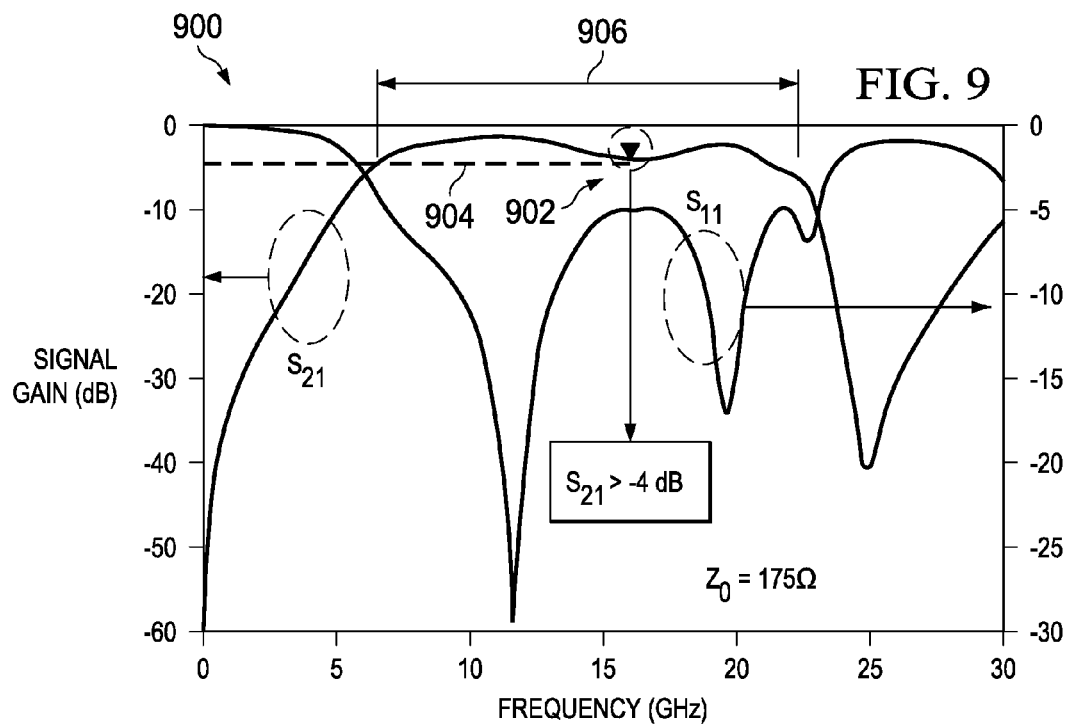
FIG. 9 illustrates a frequency response of the example package substrate integrated isolation filter component of FIG. 8.
Figure 8:
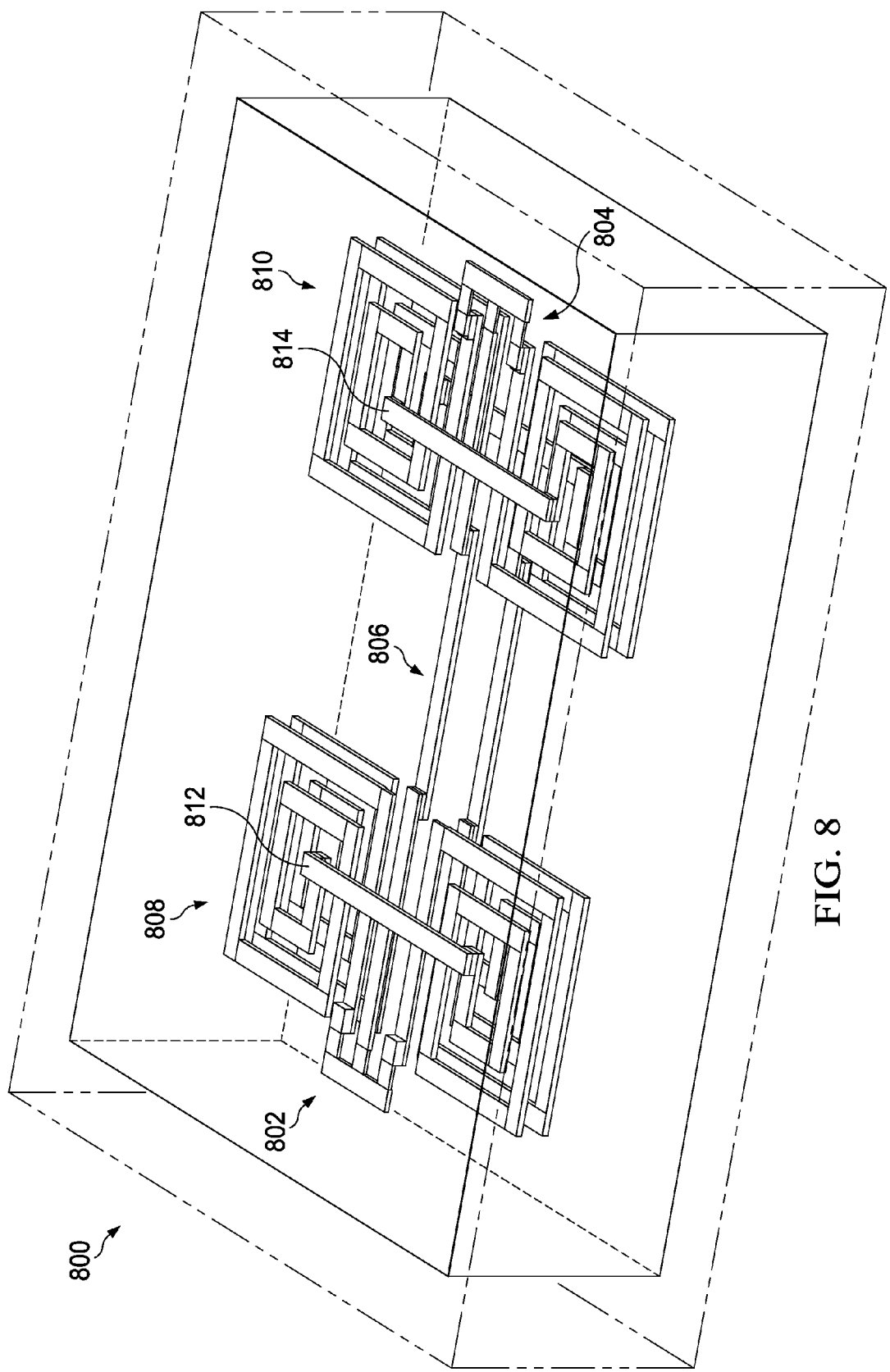
FIG. 8 is an isometric view of an example package substrate integrated isolation filter component that may implement the isolation device of FIG. 1.

FIG. 8 is a three-dimensional view of an example package substrate integrated isolation filter component 800. The example package substrate integrated isolation filter component 800 of FIG. 8 may be used to implement the isolation barrier 136 of FIG. 1. FIG. 9 illustrates a frequency response 900 of the example package substrate integrated isolation filter component 800 of FIG. 8.

The example package substrate integrated isolation filter component 800 of FIG. 8 is built on a package substrate with an effective dielectric constant ($\zeta_{\it{eff}}$) of approximately 3.8, using two of four possible levels of metallization separated by approximately 50-70 micrometers (μm). A standard 2-mm thick mold compound used for package encapsulation is not shown in FIG. 8, but the presence of the mold compound is accounted for in the response shown in FIG. 9.

Differential signal transfer between a primary side 802 of the package substrate integrated isolation filter component 800 and a secondary side 804 of the package substrate integrated isolation filter component 800 occurs as a result of vertical and horizontal coupling. The example package substrate integrated isolation filter component 800 includes a first isolation device 808 in communication with the output transformer 612 of FIG. 6. The example package substrate integrated isolation filter component 800 also includes a second isolation device 810 in communication with the input transformer 710 of FIG. 7.

Two electro-magnetically coupled vertical portions (e.g., the isolation devices 808, 810) act as resonant tanks that are electrically coupled through the horizontal differential transmission-lines 806. Using a serially connected topology, the package substrate integrated isolation filter component 800 provides for improved isolation compared to transformer-based, vertical-only coupled topologies that are built on similar platforms. Center-taps 812, 814 of the package substrate integrated isolation filter component 800 are terminated to improve common-mode signal rejection.

In FIG. 9, the simulated response 900 indicates that the example package substrate integrated isolation filter component 800 of FIG. 8 has a center frequency 902 of about 16 GHz with approximately a 4 dB average in-band signal loss and more than 75% percentage bandwidth. The native, higher 175Ω characteristic impedance ($Z_O$) of the example package substrate integrated isolation filter component 800 of FIG. 8 improves power efficiency compared to an equivalent design with a 100-Ω differential termination.

Figure 10:
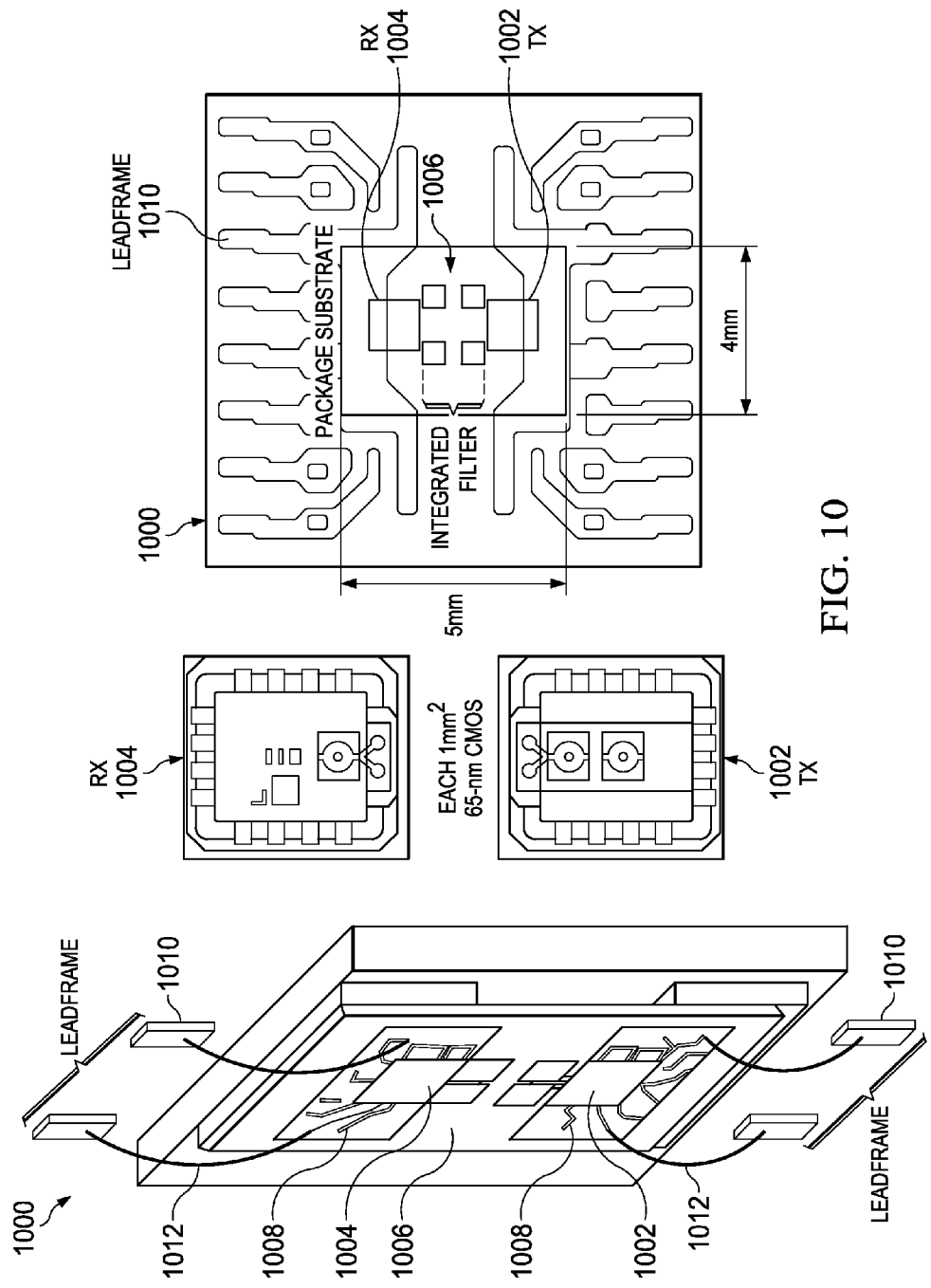
FIG. 10 illustrates an example assembled isolation device that implements the isolation device of FIG. 1.

FIG. 10 illustrates an example assembled isolation device 1000 that implements the isolation device 100 of FIG. 1. In the example assembled isolation device 1000, a 1-mm$^2$ transmit die 1002 and a 1-mm$^2$ receive die 1004 implemented using a 65-nm CMOS technology. The dies 1002, 1004 are bumped, flipped, and mounted on the substrate 1006 that houses the galvanic isolator (e.g., the isolation barrier 136). In addition to the assembled isolation device 1000, the substrate also includes peripheral artwork for making connections to a 16-pin wide-body molded lead-frame. Bond-fingers 1008 on the substrate 1006 are attached to leads 1010 using conventional bond-wires 1012.

FIG. 11 illustrates an example of the power amplifiers 116 of FIGS. 1 and/or 6 generating the modulated signal 134 based on a continuous on-off keying scheme in "Turbo" mode. FIG. 11 illustrates the example buffered input signal 112 (or the input signal 102) with multiple pulses 1102-1110 of different widths, the clock signal 128, and the resulting modulated signal 134.

As illustrated in FIG. 11, while the buffered input signal 112 has a high signal level (e.g., logical 1, a high voltage level) during the pulses 1102-1110, the example power amplifier 116 outputs pulses 1112-1120 that correspond to (e.g., at the frequency of) the clock signal 128. Thus, when the envelope detector 144 detects pulses in the filtered signal 142 (e.g., the pulses 1112-1120), the example envelope detector 144 outputs the envelope signal 146 that represents the pulses 1102-1110 in the buffered input signal 112.

FIG. 12 illustrates example energy-per-bit values as a function of data-rate in "Turbo" mode and "Burst" mode for the example isolation device 100 of FIG. 1. The energy-per-bit for "Turbo" mode is shown as first measurements 1202, and the energy-per-bit for "Burst" mode is shown as second measurements 1204. The measurements 1202, 1204 meet a lower bit error rate (BER) of $10^{-12}$, with data randomization of $2^{31}$ using pseudorandom binary sequence PRBS-31. The example isolation device 100 is configured to support LVDS while driving a 100Ωdifferential output. The "Burst" mode operation is limited to a data rate of approximately 200 Mbps due to the inherent latency involved in transmit encoding and receive decoding. Energy-per-bit is significantly increased at low speeds in the "Turbo" mode. The benefit of the isolation device 100 in energy-per-bit increases as the data rate decreases.

Table 1 below illustrates a comparison of performance characteristics for the example isolation device 100 of FIG. 1 and two known digital isolators. The first known digital isolator (Prior Art 1) in Table 1 below is described in Y. Moghe et. al, *Int. SOI Conf*, pp. 1-2, October 2012. The second known digital isolator (Prior Art 2) in Table 1 below is the Si86xx family of digital isolators sold by Silicon Labs®. As shown in Table 1, the example isolation device 100 of FIG. 1 has improved isolation ratings, upper data rates, CMT immunity, latency, and energy per bit, compared to the known digital isolators.

TABLE 1

Summary and Comparison of Example Isolation Circuit and Prior Solutions

| Figure-of-Merit | This work | Prior Art 1 | Prior Art 2 |
| --- | --- | --- | --- |
| Iso. Rating (kV$_{rms}$) | ≥7.5 | 2.5 | 5 |
| Upper. data-rate (Mbps) | 2500 | 640 | 150 |
| CMTI (kV/μs) | 145 (1 Gbps) | — | 50 |
| | >150 (<600 Mbps) | — | (Static) |
| Latency (ns) | 2 | 7 | 10 |
| E/bit (pJ/bit) | 20 (2.5 Gbps) | 280 | 87.5 |

Figure 13:
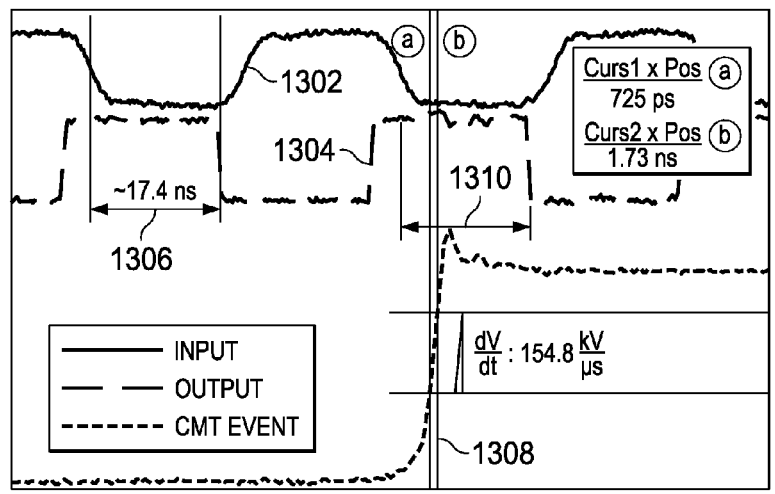
FIG. 13 illustrates an example measured input waveform, a measured output waveform, and propagation delay in the presence of a common mode transient event for the isolation device of FIG. 1.
Figure 14:
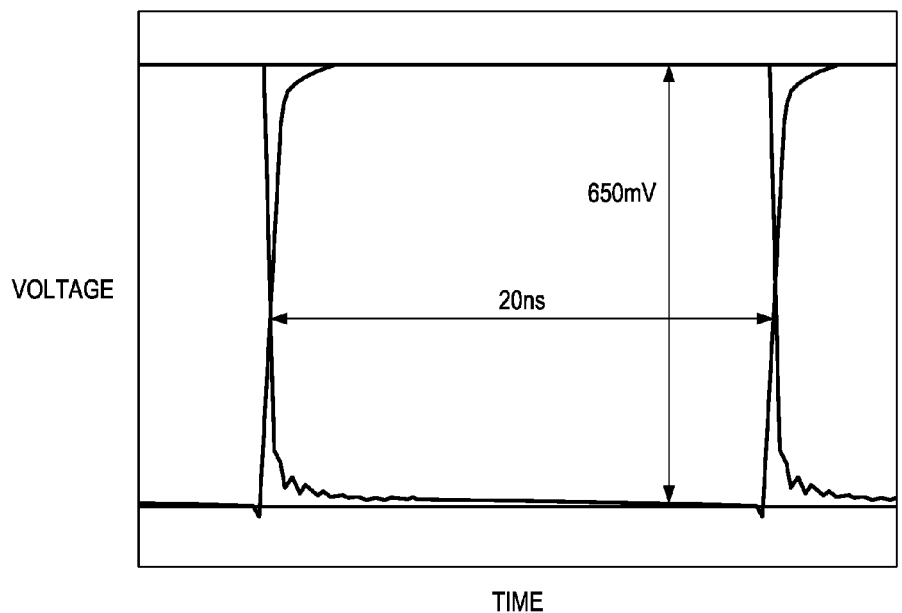
FIG. 14 shows a representative eye-diagram of one side of a low-voltage digital signaling (LVDS) output signal of FIG. 13 (at a 2 Gbps data speed) while driving a 50-Ω load.

FIG. 13 illustrates an example measured input waveform 1302, a measured output waveform 1304, and propagation delay 1306 in the presence of a common mode transient event 1308 for the isolation device 100 of FIG. 1. The example measured input waveform 1302 measures the input signal 102 and the measured output waveform 1304 measures the output signal 106. As shown in FIG. 13, the propagation delay 1306 between the falling edge of the measured input waveform 1302 and the measured output waveform 1304 is approximately 17.4 nanoseconds (ns). The propagation delay 1306 is approximately the same as a second propagation delay 1310 in the presence of the common mode transient event 1308. FIG. 14 shows a representative eye-diagram 1152 of one side of the LVDS output signal of FIG. 13 (at 2Gbps) driving a 50-Ω equipment load. The example eye-diagram 1152 has a wide eye opening.

Figure 15:
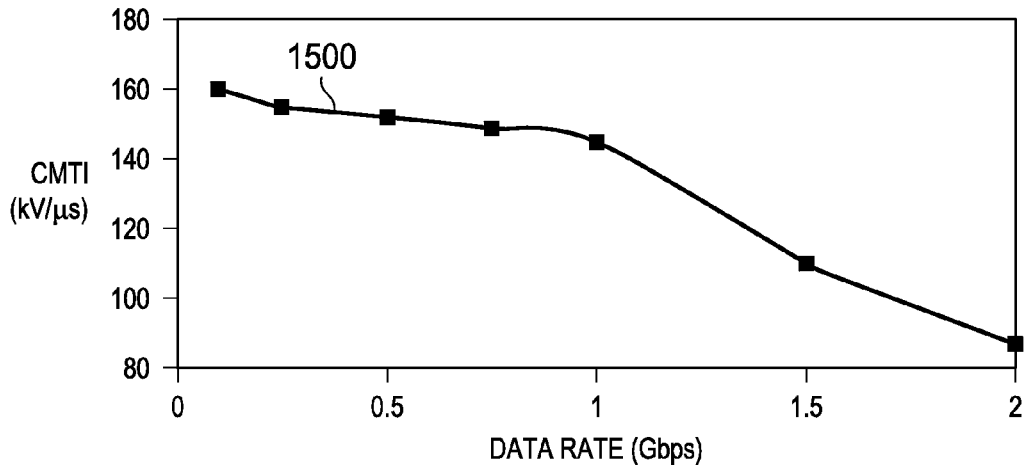
FIG. 15 illustrates an example sustainable common mode transient (CMT) impairment as a function of data rate for the isolation device of FIG. 1.

FIG. 15 illustrates an example upper sustainable CMT impairment 1500 as a function of data speed for the isolation device 100 of FIG. 1. CMT-instigated jitter affects the data eye opening in differential signaling (e.g., the data eye opening of FIG. 14). Thus, as shown in FIG. 15, a reduction in resilience to CMT occurs in the upper sustainable CMT impairment 1500 at higher data speeds compared to lower data speeds.

While an example manner of implementing the isolation device 100 of FIG. 1 is illustrated in FIGS. 2, 3, 6, 7, 8, and 10, one or more of the elements, processes and/or devices illustrated in FIGS. 2, 3, 6, 7, 8, and 10 may be combined, divided, re-arranged, omitted, eliminated and/or implemented in any other way. Further, the example ESD/Buffer circuits 110, 154, the example burst encoders 114, the example power amplifiers 116, the example data speed identifiers 118, 148, the example clock divider 126, the example free-running oscillator 130, the example isolation barrier 136, the example high pass filter 140, the example envelope detector 144, 700, the example edge pattern detectors 152, the example rising edge detector 202, the example falling edge detector 204, the example pulse modulator 206, the example switching circuits 212, 214, the example pulse counter 402, the example count converter 404, the state machine 406, the watchdog timer 418 and/or, more generally, the example isolation device 100 of FIG. 1 may be implemented by hardware, software, firmware and/or any combination of hardware, software and/or firmware. Thus, for example, any of the example ESD/Buffer circuits 110, 154, the example burst encoders 114, the example power amplifiers 116, the example data speed identifiers 118, 148, the example clock divider 126, the example free-running oscillator 130, the example isolation barrier 136, the example high pass filter 140, the example envelope detector 144, 700, the example edge pattern detectors 152, the example rising edge detector 202, the example falling edge detector 204, the example pulse modulator 206, the example switching circuits 212, 214, the example pulse counter 402, the example count converter 404, the state machine 406, the watchdog timer 418 and/or, more generally, the example isolation device 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example ESD/Buffer circuits 110, 154, the example burst encoders 114, the example power amplifiers 116, the example data speed identifiers 118, 148, the example clock divider 126, the example free-running oscillator 130, the example isolation barrier 136, the example high pass filter 140, the example envelope detectors 144, 700, the example edge pattern detectors 152, the example rising edge detector 202, the example falling edge detector 204, the example pulse modulator 206, the example switching circuits 212, 214, the example pulse counter 402, the example count converter 404, the state machine 406, and/or the watchdog timer 418 is/are hereby expressly defined to include a tangible computer readable storage device or storage disk such as a memory, a digital versatile disk (DVD), a compact disk (CD), a Blu-ray disk, etc. storing the software and/or firmware. Further still, the example isolation device 100 of FIG. 1 may include one or more elements, processes and/or devices in addition to, or instead of, those illustrated in FIGS. 2, 3, 6, 7, 8, and 10, and/or may include more than one of any or all of the illustrated elements, processes and devices.

Figure 16:
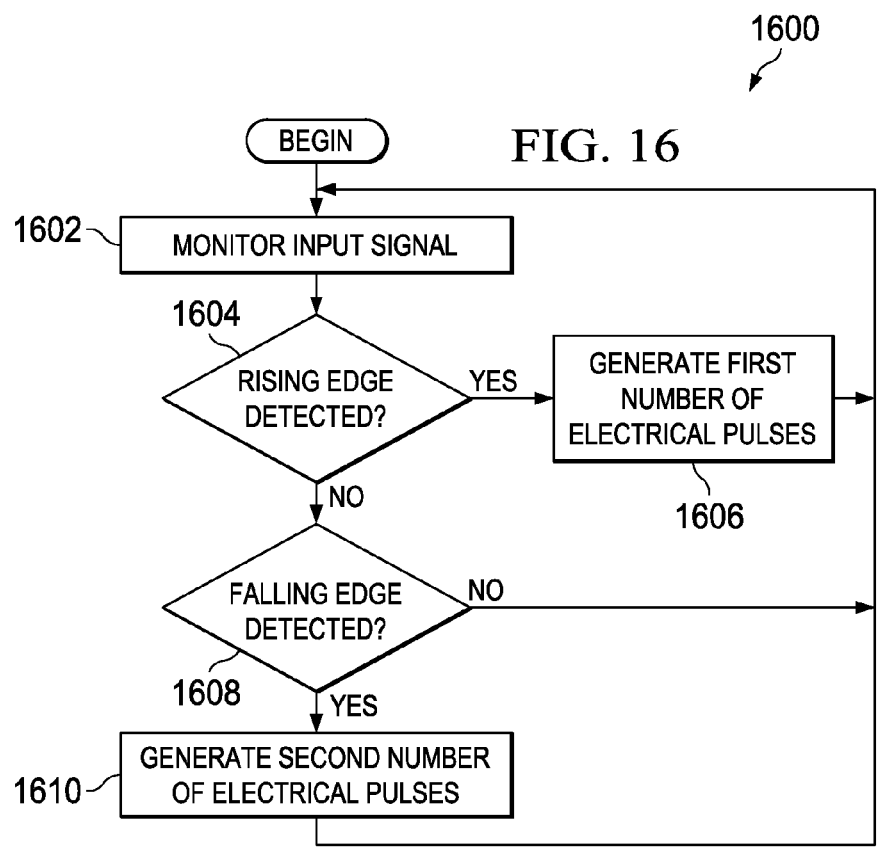
FIG. 16 is a flowchart representative of example machine readable instructions that may be executed to implement the example burst encoders of FIGS. 1 and/or 2 to generate electrical pulses in response to detecting rising and falling edges in an input signal.
Figure 17:
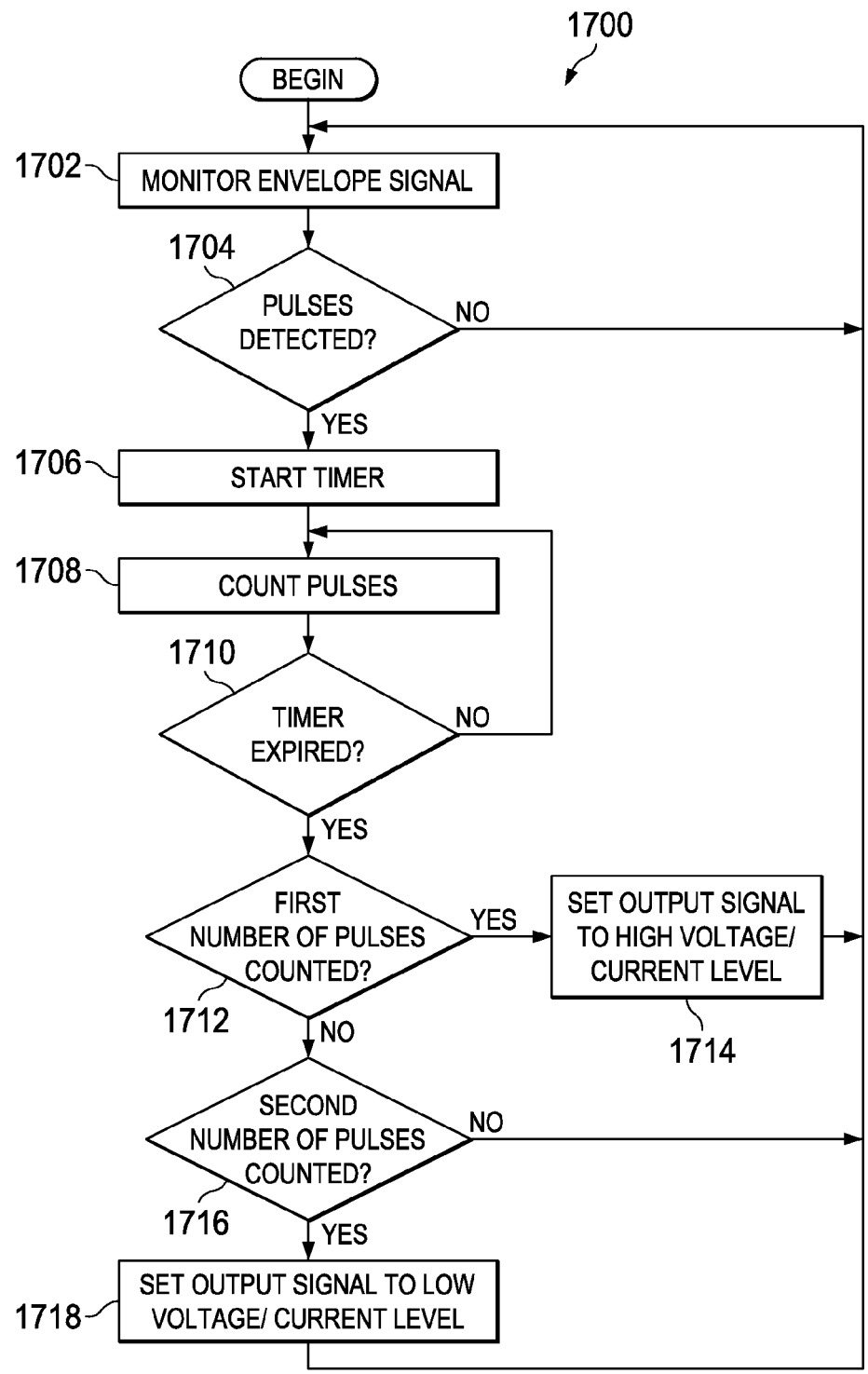
FIG. 17 is a flowchart representative of example machine readable instructions that may be executed to implement the example edge pattern detectors of FIGS. 1 and/or 4 to generate an output signal based on counting electrical pulses present in an envelope signal.

Flowcharts representative of example machine readable instructions for implementing the isolation device 100 of FIG. 1 are shown in FIGS. 16 and 17. In this example, the machine readable instructions comprise program(s) for execution by a processor such as the processor 1812 shown in the example processor platform 1800 discussed below in connection with FIG. 18. The program(s) may be embodied in software stored on a tangible computer readable storage medium such as a CD-ROM, a floppy disk, a hard drive, a digital versatile disk (DVD), a Blu-ray disk, or a memory associated with the processor 1812, but the entire program(s) and/or parts thereof could alternatively be executed by a device other than the processor 1812 and/or embodied in firmware or dedicated hardware. Further, although the example program(s) are described with reference to the flowcharts illustrated in FIGS. 16 and 17, many other methods of implementing the example isolation device 100 may alternatively be used. For example, the order of execution of the blocks may be changed, and/or some of the blocks described may be changed, eliminated, or combined.

As mentioned above, the example processes of FIGS. 16 and/or 17 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). In at least one example, the term tangible computer readable storage medium is defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 16 and 17 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). In at least one example, the term non-transitory computer readable medium is defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

FIG. 16 is a flowchart representative of example machine readable instructions 1116 which may be executed to implement the example burst encoders 114 of FIGS. 1 and/or 2 to generate electrical pulses in response to detecting rising and falling edges in an input signal (e.g., the buffered input signal 112).

The example rising edge detector 202 and the example falling edge detector 204 monitor an input signal (e.g., the buffered input signal 112 of FIGS. 1 and 2) (block 1602). The rising edge detector 202 determines whether a rising edge has been detected (block 1604).

If the rising edge detector 202 detects a rising edge (block 1604), the example pulse modulator 206 of FIG. 2 generates a first number of electrical pulses (block 1606). For example, when the rising edge detector 202 detects the rising edge 303 of FIG. 3, the rising edge detector 202 outputs the rising edge trigger signal 208, which causes the pulse modulator 206 to output the first number of electrical pulses (e.g., the 2 pulses 307 of FIG. 3). To generate the 2 pulses 307, the example switching circuit 212 of the pulse modulator 206 connects the divided clock signal 122 to an output of the pulse modulator 206 (e.g., the encoded signal 132) for a specified time.

If the rising edge detector 202 does not detect a rising edge (block 1604), the falling edge detector 204 determines whether a falling edge has been detected (block 1608).

If the falling edge detector 204 detects a falling edge (block 1608), the example pulse modulator 206 of FIG. 2 generates a second number of electrical pulses (block 1610). For example, when the falling edge detector 204 detects the falling edge 309 of FIG. 3, the falling edge detector 204 outputs the falling edge trigger signal 210, which causes the pulse modulator 206 to output the second number of electrical pulses (e.g., the 4 pulses 313 of FIG. 3). To generate the 4 pulses 313, the example switching circuit 214 of the pulse modulator 206 connects the divided clock signal 124 to the output of the pulse modulator 206 (e.g., the encoded signal 132) for the specified time.

After generating the second number of pulses (block 1610), generating the first number of pulses (block 1606), or if neither a rising edge nor a falling edge are detected (block 1608), control returns to block 1602 to continue monitoring the input signal. The example instructions 1116 may continue to iterate while the isolation device 100 is energized (e.g., powered, turned on).

FIG. 17 is a flowchart representative of example machine readable instructions 1700 which may be executed to implement the example edge pattern detectors 152 of FIGS. 1 and/or 4 to generate an output signal (e.g., the output signal 156) based on counting electrical pulses present in an envelope signal (e.g., the envelope signal 146).

The example pulse counter 402 of FIG. 4 monitors an envelope signal (e.g., the envelope signal 146 of FIGS. 1 and/or 4) (block 1702). The example pulse counter 402 determines whether electrical pulses are detected (block 1704). For example, the pulse counter 402 may use a voltage level detector or a current level detector to determine whether a voltage or current has exceeded a threshold.

When a pulse is detected (block 1704), the example pulse counter 402 starts a timer (block 1706). For example, the pulse counter 402 may start the watchdog timer 418 via a start signal 420 when the pulse counter 402 detects a pulse. The pulse counter 402 counts pulses in the envelope signal 146 (block 1708). For example, the pulse counter 402 may use a state machine, such as the state machine 406, to keep track of the received pulses and/or to map the received pulses to rising edge or falling edge.

The example pulse counter 402 determines whether the timer (e.g., the watchdog timer 418) has expired (block 1710). For example, the pulse counter 402 may determine that the timer has expired when a time out signal 422 is received. If the timer has not expired (block 1710), control returns to block 1708 to continue counting pulses.

When the timer has expired (block 1710), the example count converter 404 determines whether a first number of pulses has been counted (e.g., by the pulse counter 402 during the period counted by the watchdog timer 418) (block 1712). If the first number of pulses was counted by the pulse counter 402, the example count converter 404 sets an output signal (e.g., the output signal 156) to a high voltage/current level (block 1714). For example, when the pulse counter 402 counts 2 pulses during the time period 504, the example count converter 404 causes the rising edge 508 in the output signal 156 by changing the output signal 156 to a high voltage.

On the other hand, if the first number of pulses was not counted by the pulse counter 402 (block 1712), the example count converter 404 determines whether a second number of pulses has been counted (e.g., by the pulse counter 402 during the period counted by the watchdog timer 418) (block 1716). If the second number of pulses was counted by the pulse counter 402, the example count converter 404 sets an output signal (e.g., the output signal 156) to a low voltage/current level (block 1718). For example, when the pulse counter 402 counts 4 pulses during the time period 512, the example count converter 404 causes the falling edge 516 in the output signal 156 by changing the output signal 156 to a low voltage.

After setting the output signal to a low voltage/current level (block 1718) or setting the output signal to a high voltage/current level (block 1714), or if neither the first number of pulses is counted nor the second number of pulses is counted (block 1716), or if no pulses are detected (block 1704), control returns to block 1702 to continue monitoring the envelope signal 146. The example instructions 1700 may continue to iterate while the isolation device 100 is energized (e.g., powered, turned on).

Figure 18:
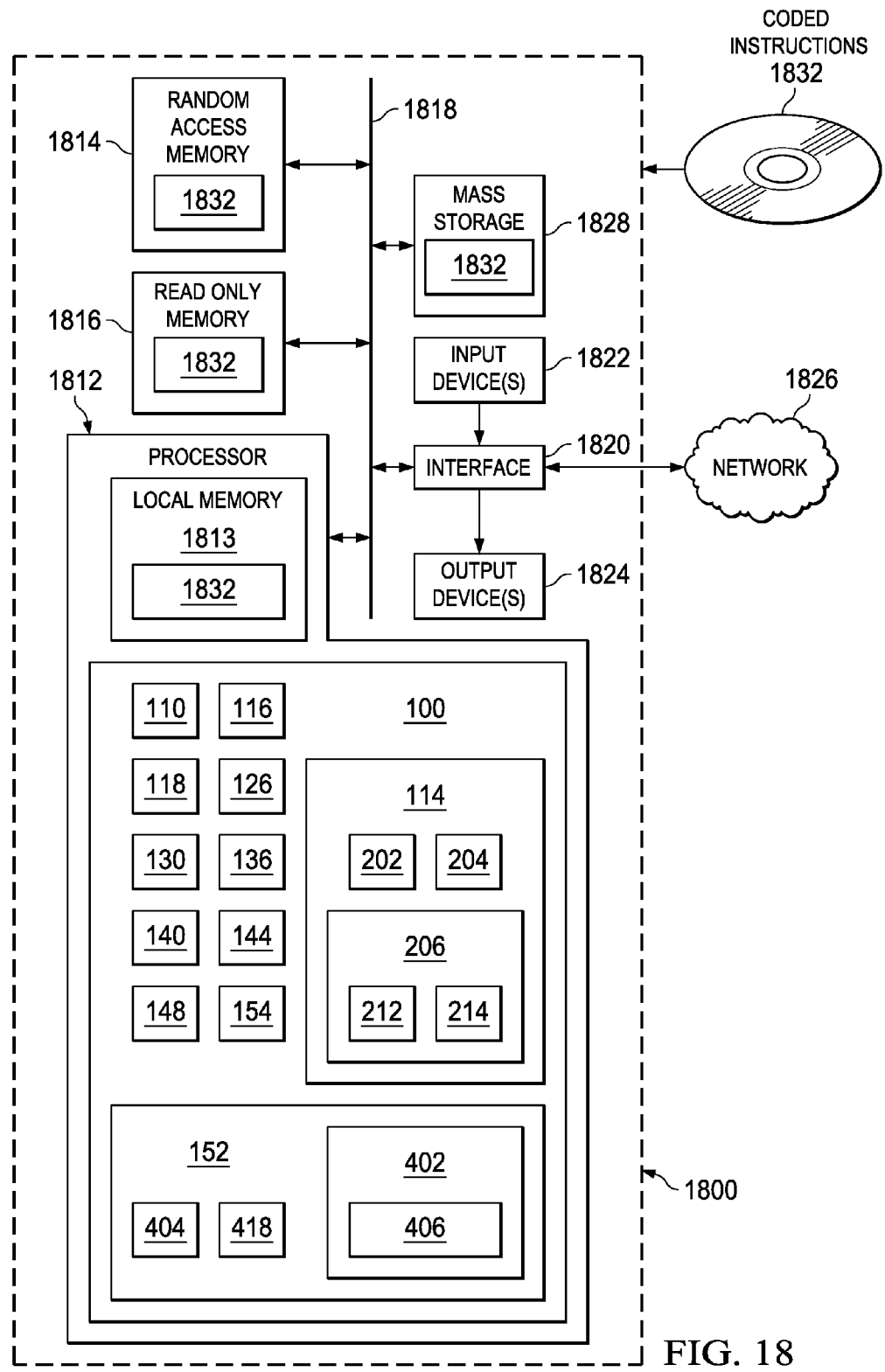
FIG. 18 is a block diagram of an example processor platform capable of executing the instructions of FIGS. 16 and/or 17 to implement the apparatus disclosed in FIGS. 1, 2, 3, 6, 7, 8, and 10.

FIG. 18 is a block diagram of an example processor platform 1800 capable of executing the instructions of FIGS. 16 and/or 17 to implement the example ESD/Buffer circuits 110, 154, the example burst encoders 114, the example power amplifiers 116, the example data speed identifiers 118, 148, the example clock divider 126, the example free-running oscillator 130, the example isolation barrier 136, the example high pass filter 140, the example envelope detector 144, 700, the example edge pattern detectors 152, the example rising edge detector 202, the example falling edge detector 204, the example pulse modulator 206, the example switching circuits 212, 214, the example pulse counter 402, the example count converter 404, the state machine 406, the watchdog timer 418 and/or, more generally, the example isolation device 100 of FIGS. 1, 2, 3, 6, 7, 8, and 10. The processor platform 1800 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1800 of the illustrated example includes a processor 1812. The processor 1812 of the illustrated example is hardware. For example, the processor 1812 can be implemented by one or more integrated circuits, logic circuits, microprocessors or controllers from any desired family or manufacturer.

The processor 1812 of the illustrated example includes a local memory 1813 (e.g., a cache). The processor 1812 of the illustrated example is in communication with a main memory including a volatile memory 1814 and a non-volatile memory 1816 via a bus 1818. The volatile memory 1814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1816 may be implemented by flash memory and/or any other desired type of memory device. Access to the main memory 1814, 1816 is controlled by a memory controller.

The processor platform 1800 of the illustrated example also includes an interface circuit 1820. The interface circuit 1820 may be implemented by any type of interface standard, such as an Ethernet interface, a universal serial bus (USB), and/or a PCI express interface.

In the illustrated example, one or more input devices 1822 are connected to the interface circuit 1820. The input device(s) 1822 permit(s) a user to enter data and commands into the processor 1812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1824 are also connected to the interface circuit 1820 of the illustrated example. The output devices 1824 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1820 of the illustrated example, thus, typically includes a graphics driver card, a graphics driver chip or a graphics driver processor.

The interface circuit 1820 of the illustrated example also includes a communication device such as a transmitter, a receiver, a transceiver, a modem and/or network interface card to facilitate exchange of data with external machines (e.g., computing devices of any kind) via a network 1826 (e.g., an Ethernet connection, a digital subscriber line (DSL), a telephone line, coaxial cable, a cellular telephone system, etc.).

The processor platform 1800 of the illustrated example also includes one or more mass storage devices 1828 for storing software and/or data. Examples of such mass storage devices 1828 include floppy disk drives, hard drive disks, compact disk drives, Blu-ray disk drives, RAID systems, and digital versatile disk (DVD) drives.

The coded instructions 1832 of FIGS. 16 and/or 17 may be stored in the mass storage device 1828, in the volatile memory 1814, in the non-volatile memory 1816, and/or on a removable tangible computer readable storage medium such as a CD or DVD.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An isolation circuit, comprising:
an isolation barrier to electrically isolate a first circuit from a second circuit;
a burst encoder in the first circuit, the burst encoder to:
   generate a first pattern in response to receiving a rising edge on an input signal; and
   generate a second pattern in response to receiving a falling edge on the input signal; and
an edge pattern detector in the second circuit, the edge pattern detector to:
   detect the first pattern or the second pattern received from the burst encoder via the isolation barrier;
   set an output signal at a first signal level in response to detecting the first pattern; and
   set the output signal at a second signal level in response to detecting the second pattern;
wherein the burst encoder generates the first pattern by generating a first number of electrical pulses by outputting a first oscillating signal for a first time period;
wherein the burst encoder generates the second pattern by generating a second number of electrical pulses by outputting a second oscillating signal for the first time period, the second oscillating signal having a different frequency than the first oscillating signal; and
a divider to generate the first oscillating signal by dividing a third oscillating signal by a first divisor and to generate the second oscillating signal by dividing the third oscillating signal by a second divisor.

2. An isolation circuit, comprising:
an isolation barrier to electrically isolate a first circuit from a second circuit;
a burst encoder in the first circuit, the burst encoder to:
   generate a first pattern in response to receiving a rising edge on an input signal; and
   generate a second pattern in response to receiving a falling edge on the input signal; and
an edge pattern detector in the second circuit, the edge pattern detector to:
   detect the first pattern or the second pattern received from the burst encoder via the isolation barrier;
   set an output signal at a first signal level in response to detecting the first pattern; and
   set the output signal at a second signal level in response to detecting the second pattern;
wherein the burst encoder generates the first pattern by generating a first number of electrical pulses by outputting a first oscillating signal for a first time period;
wherein the burst encoder generates the second pattern by generating a second number of electrical pulses by outputting a second oscillating signal for the first time period, the second oscillating signal having a different frequency than the first oscillating signal; and
wherein the burst encoder includes:
a rising edge detector to detect the rising edge and to generate a rising edge trigger signal in response to the detection of the rising edge;
a falling edge detector to detect the falling edge and to generate a falling edge trigger signal in response to the detection of the falling edge; and
a pulse modulator to modulate a carrier signal to generate the first number of electrical pulses in response to the rising edge trigger signal and to generate the second number of electrical pulses in response to the falling edge trigger signal.

3. An isolation circuit, comprising:
an isolation barrier to electrically isolate a first circuit from a second circuit;
a burst encoder in the first circuit, the burst encoder to:
generate a first pattern in response to receiving a rising edge on an input signal; and
generate a second pattern in response to receiving a falling edge on the input signal; and
an edge pattern detector in the second circuit, the edge pattern detector to:
detect the first pattern or the second pattern received from the burst encoder via the isolation barrier;
set an output signal at a first signal level in response to detecting the first pattern; and
set the output signal at a second signal level in response to detecting the second pattern;
wherein the burst encoder generates the first pattern by generating a first number of electrical pulses by outputting a first oscillating signal for a first time period;
wherein the burst encoder generates the second pattern by generating a second number of electrical pulses by outputting a second oscillating signal for the first time period, the second oscillating signal having a different frequency than the first oscillating signal; and
wherein the edge pattern detector includes:
a pulse counter to determine a number of sequential electrical pulses on an envelope signal between a first idle signal level on the input signal and a second idle signal level on the input signal; and
a count converter to set the output signal at the first signal level or the second signal level based on the number of the sequential electrical pulses determined by the pulse counter.

4. The isolation circuit in claim 3, in which the pulse counter is to implement a state machine to determine the number of the sequential electrical pulses on the input signal during a time period occurring between the first idle signal level on the input signal and the second idle signal level on the input signal.

5. The isolation circuit as defined in claim 3, in which the pulse counter is to start a timer in response to detecting a first electrical pulse on the input signal, and is to determine the number of the sequential electrical pulses occurring between the starting of the timer and a completion of the timer.

6. An isolation circuit, comprising:
an isolation barrier to electrically isolate a first circuit from a second circuit;
a burst encoder in the first circuit, the burst encoder to:
generate a first pattern in response to receiving a rising edge on an input signal; and
generate a second pattern in response to receiving a falling edge on the input signal; and
an edge pattern detector in the second circuit, the edge pattern detector to:
detect the first pattern or the second pattern received from the burst encoder via the isolation barrier;
set an output signal at a first signal level in response to detecting the first pattern; and
set the output signal at a second signal level in response to detecting the second pattern;
a first data speed identifier to:
determine a first data speed of the input signal;
when the first data speed satisfies a threshold data speed, cause the input signal to bypass the burst encoder; and
when the first data speed does not satisfy the threshold, cause the input signal to be input to the burst encoder; and
a second data speed identifier to:
detect a second data speed of a modulated signal output by the isolation barrier;
when the second data speed satisfies the threshold data speed, cause the modulated signal to bypass the edge pattern detector to set the output signal based on the modulated signal; and
when the second data speed does not satisfy the threshold data speed, cause the modulated signal to be input to the edge pattern detector to enable the edge pattern detector to detect the first pattern or the second pattern in the modulated signal.

7. A method, comprising:
generating a first signal pattern in a first voltage domain in response to receiving a first rising edge on an input signal;
transmitting the first signal pattern to an electrical isolation barrier;
detecting the first signal pattern received in a second voltage domain via the electrical isolation barrier;
in response to detecting the first signal pattern, outputting a second rising edge on an output signal in the second voltage domain;
generating a second signal pattern in the first voltage domain in response to receiving a first falling edge on the input signal, the second signal pattern being different than the first signal pattern;
transmitting the second signal pattern to the electrical isolation barrier;
detecting the second signal pattern received in the second voltage domain via the electrical isolation barrier; and
in response to detecting the second signal pattern, outputting a second falling edge on the output signal in the second voltage domain;
wherein the generating of the first signal pattern includes generating a first number of electrical pulses by using a first oscillating signal having a first frequency to output the first number of electrical pulses at the first frequency during a time period having a specified duration;
wherein the generating of the second signal pattern includes generating a second number of electrical pulses by using a second oscillating signal having a second frequency to output the second number of electrical pulses at the second frequency during the time period.

8. The method in claim 7, further including generating the first oscillating signal from a carrier signal using a first frequency divider and generating the second oscillating signal from the carrier signal using a second frequency divider, the first and second frequency dividers having different divisors.

9. A method, comprising:
generating a first signal pattern in a first voltage domain in response to receiving a first rising edge on an input signal;
transmitting the first signal pattern to an electrical isolation barrier;
detecting the first signal pattern received in a second voltage domain via the electrical isolation barrier;
in response to detecting the first signal pattern, outputting a second rising edge on an output signal in the second voltage domain;
generating a second signal pattern in the first voltage domain in response to receiving a first falling edge on the input signal, the second signal pattern being different than the first signal pattern;

transmitting the second signal pattern to the electrical isolation barrier;

detecting the second signal pattern received in the second voltage domain via the electrical isolation barrier; and in response to detecting the second signal pattern, outputting a second falling edge on the output signal in the second voltage domain;

wherein the generating of the first signal pattern includes generating a first number of electrical pulses by using a first oscillating signal having a first frequency to output the first number of electrical pulses at the first frequency during a time period having a specified duration;

wherein the detecting of the first signal pattern includes starting a timer and determining that a first number of pulses was received between the starting of the timer and receiving of a time out signal when the timer has finished counting;

wherein the detecting of the second signal pattern includes starting the timer and determining that the second number of pulses was received between the starting of the timer and the receiving of the time out received when the timer has finished counting.

10. An apparatus, comprising:

a burst encoder having a first input, a second input, a third input, and a first output, the first output to include, during a first time period:

when a rising edge is detected on the first input, a first number of electrical pulses generated using the second input; or when a falling edge is detected on the first input, a second number of electrical pulses generated using the third input during a time period;

a power amplifier having the first output as a fourth input and having a fifth input and a second output based on the fourth input and the fifth input;

an isolation barrier having the second output as a sixth input and having a third output representative of the sixth input, the sixth input being received from a first voltage domain and the third output being generated in a second voltage domain;

a high pass filter having the third output as a seventh input, and having a fourth output, the high pass filter to attenuate common mode transients from the seventh input to generate the fourth output;

an envelope detector having the fourth output as an eighth input and having a fifth output to include an envelope of the eighth input; and an edge pattern detector having the fifth output as a ninth input and having a sixth output, the edge pattern detector to:

count a third number of electrical pulses received on the ninth input during a second time period; and set the sixth output to a first signal level when the third number of electrical pulses received is equal to the first number of electrical pulses; or set the sixth output to a second signal level different than the first signal level when the third number of electrical pulses received is equal to the second number of electrical pulses.

* * * * *